(12) United States Patent
Matsumoto et al.

(10) Patent No.: US 11,302,623 B2
(45) Date of Patent: Apr. 12, 2022

(54) ELECTRONIC DEVICE

(71) Applicant: SHINKO ELECTRIC INDUSTRIES CO., LTD., Nagano (JP)

(72) Inventors: Takayuki Matsumoto, Nagano (JP); Tsukasa Nakanishi, Nagano (JP); Tadaaki Katsuyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 152 days.

(21) Appl. No.: 16/779,875

(22) Filed: Feb. 3, 2020

(65) Prior Publication Data

US 2020/0258832 A1 Aug. 13, 2020

(30) Foreign Application Priority Data

Feb. 12, 2019 (JP) .............................. JP2019-022447

(51) Int. Cl.
*H01L 23/498* (2006.01)
*H01L 23/367* (2006.01)
*H01L 23/00* (2006.01)

(52) U.S. Cl.
CPC ...... *H01L 23/49861* (2013.01); *H01L 23/367* (2013.01); *H01L 24/13* (2013.01)

(58) Field of Classification Search
CPC .. H01L 23/49861; H01L 23/367; H01L 24/13
See application file for complete search history.

(56) References Cited

U.S. PATENT DOCUMENTS

| 2008/0048218 | A1* | 2/2008 | Jiang | H01L 23/49562 257/288 |
| 2009/0224383 | A1* | 9/2009 | Cruz | H01L 24/84 257/676 |
| 2011/0101542 | A1* | 5/2011 | Camacho | H01L 24/16 257/778 |
| 2011/0227205 | A1* | 9/2011 | Lu | H01L 23/49537 257/670 |

FOREIGN PATENT DOCUMENTS

WO 2016076162 A1 5/2016

* cited by examiner

*Primary Examiner* — Peniel M Gumedzoe
(74) *Attorney, Agent, or Firm* — Tarolli, Sundheim, Covell & Tummino LLP

(57) ABSTRACT

An electronic device includes a first metal plate including a first wiring and a second wiring, an electronic component mounted on a lower surface of the first wiring so as to overlap the second wiring in plan view, a second metal plate including an electrode electrically connected to the lower surface of the first wiring, and an insulation layer filling a space between the first metal plate, the second metal plate, and the electronic component and covering the electronic component. The upper surface of the second wiring is exposed from the insulation layer.

16 Claims, 18 Drawing Sheets

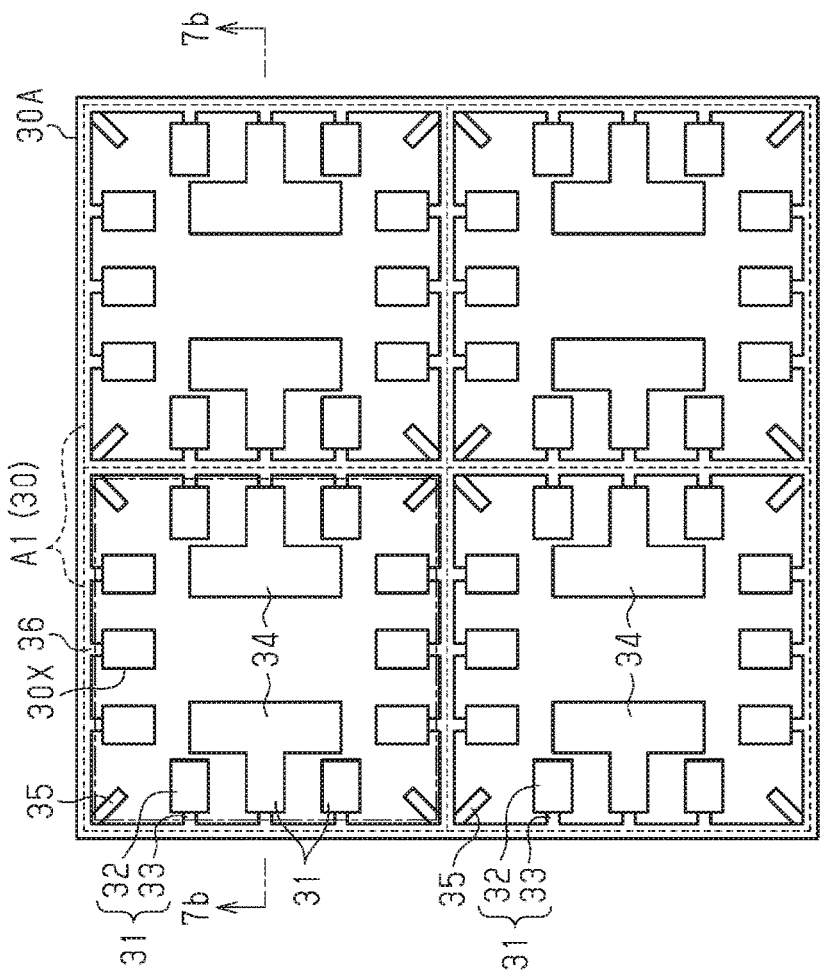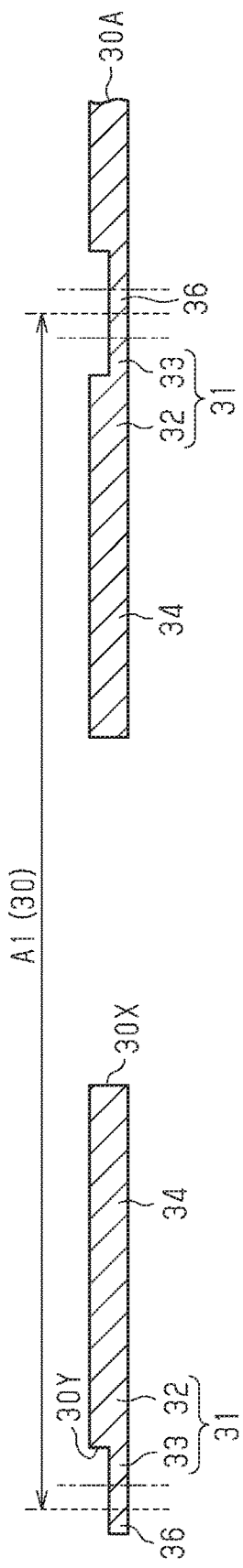
Fig.7A
Fig.7B

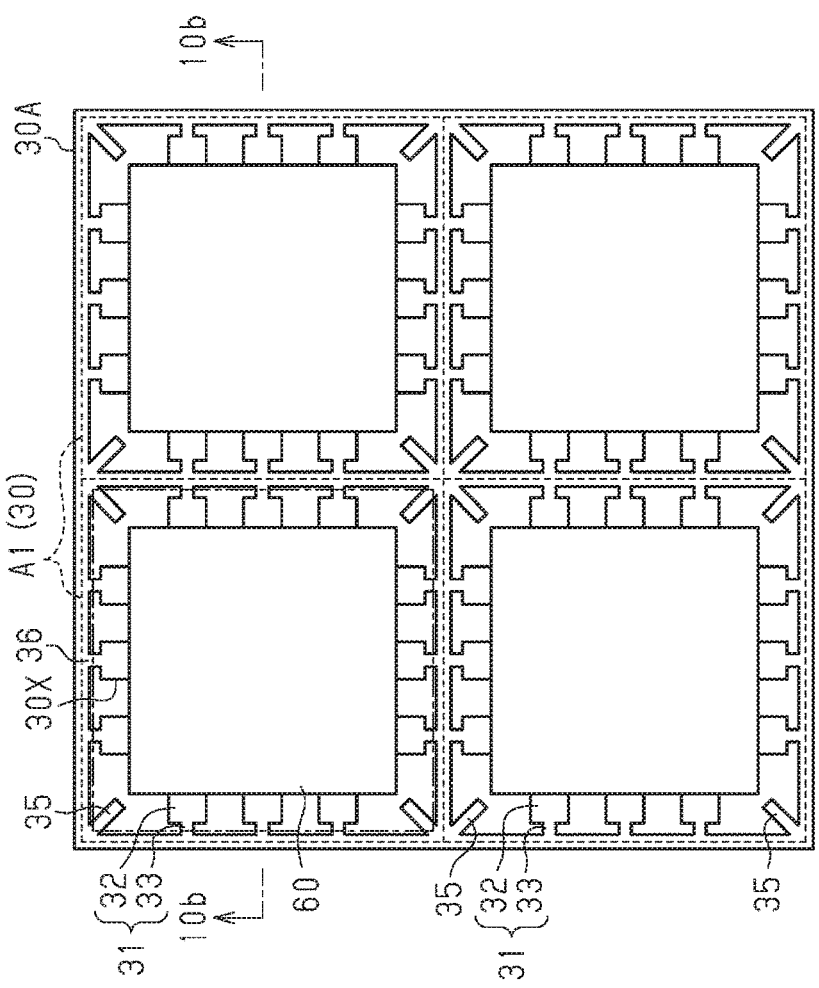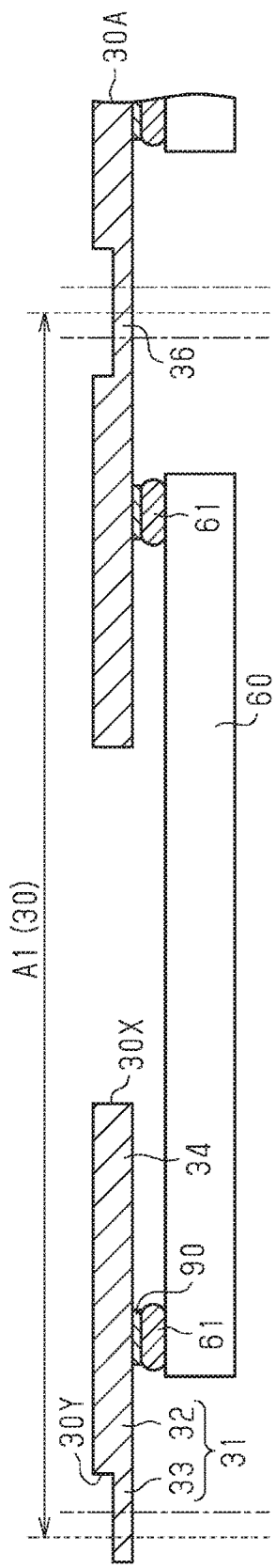
Fig.10A
Fig.10B

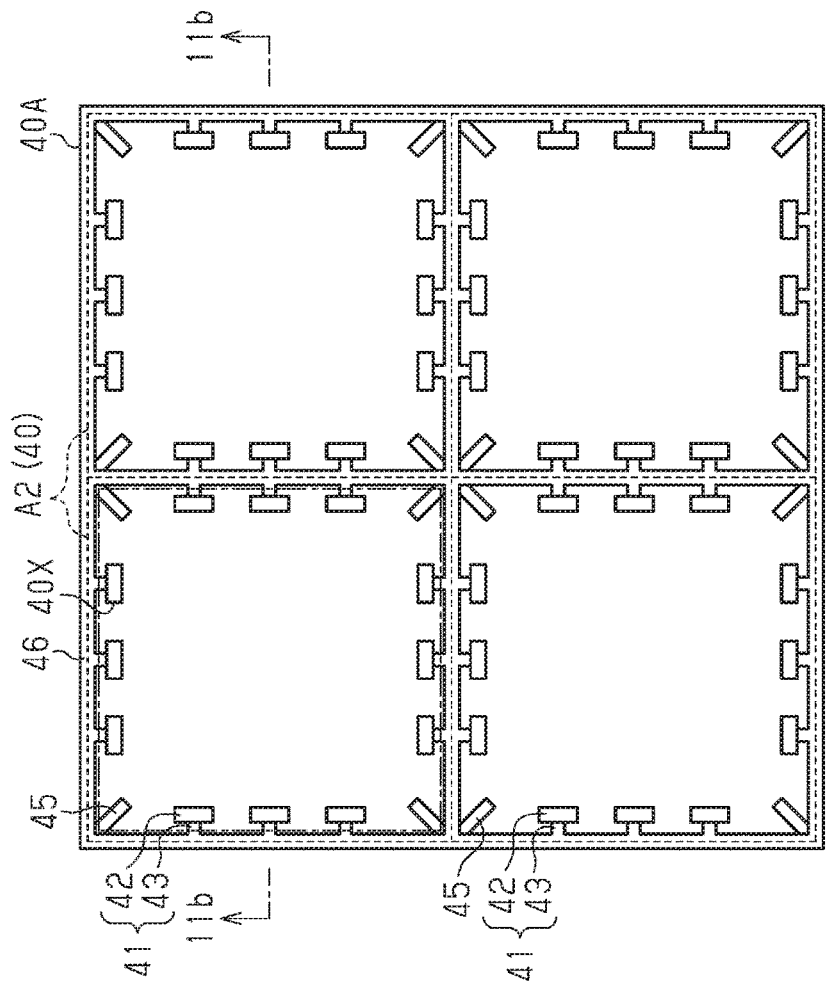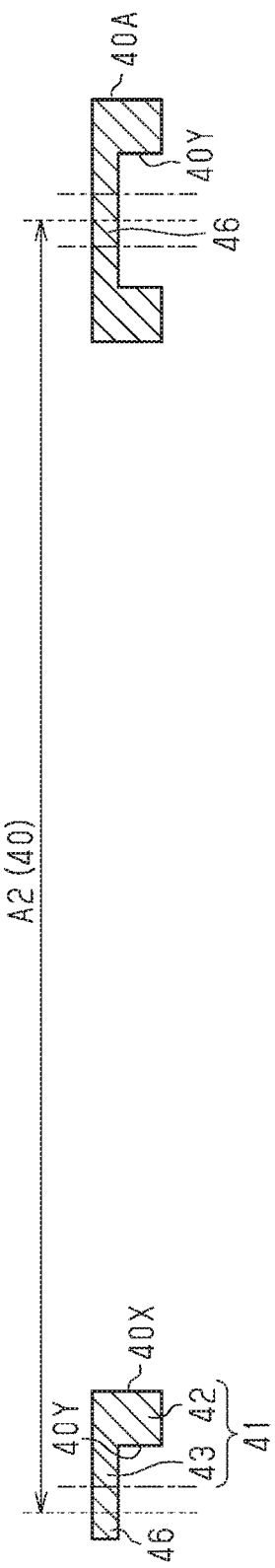

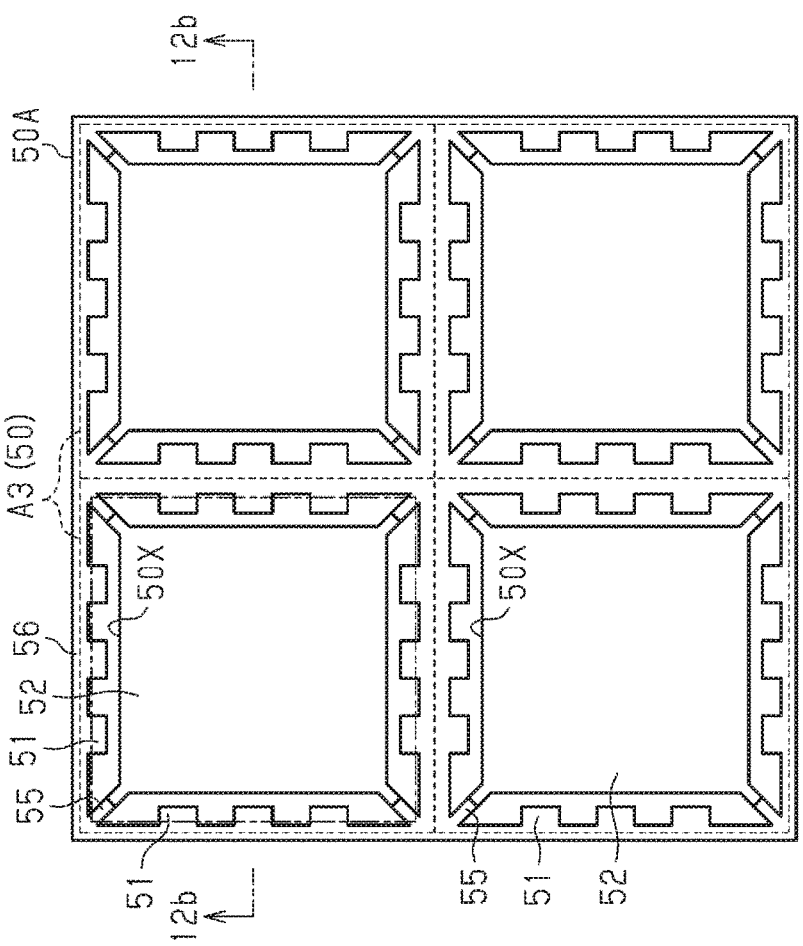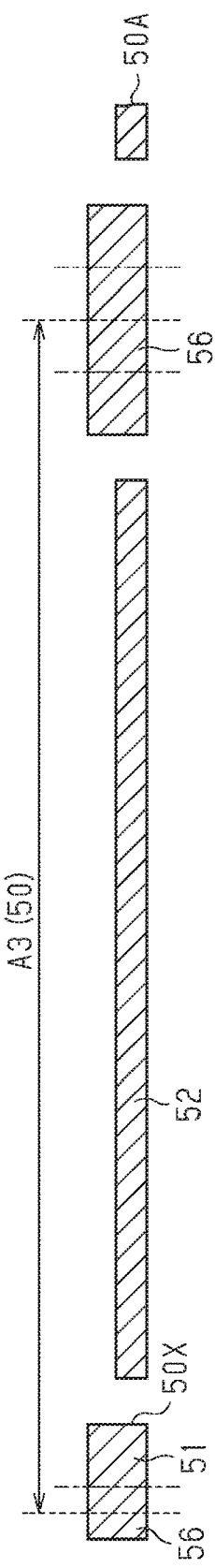

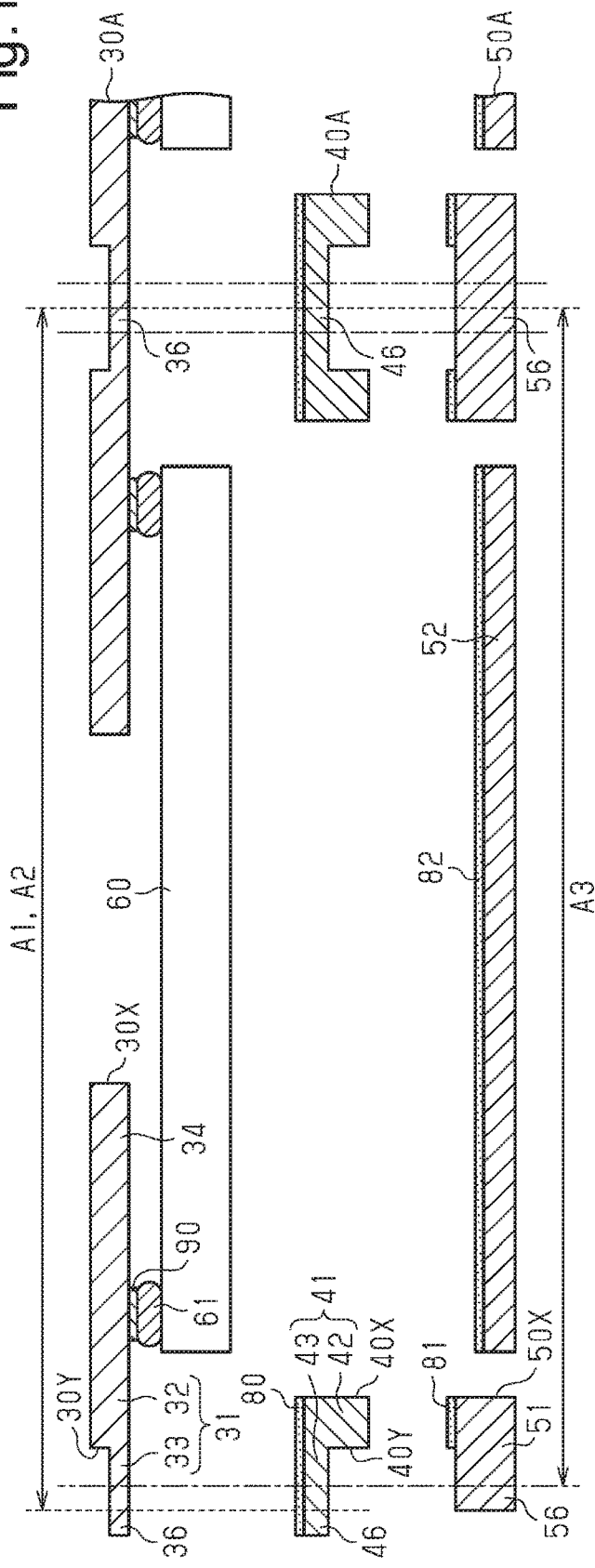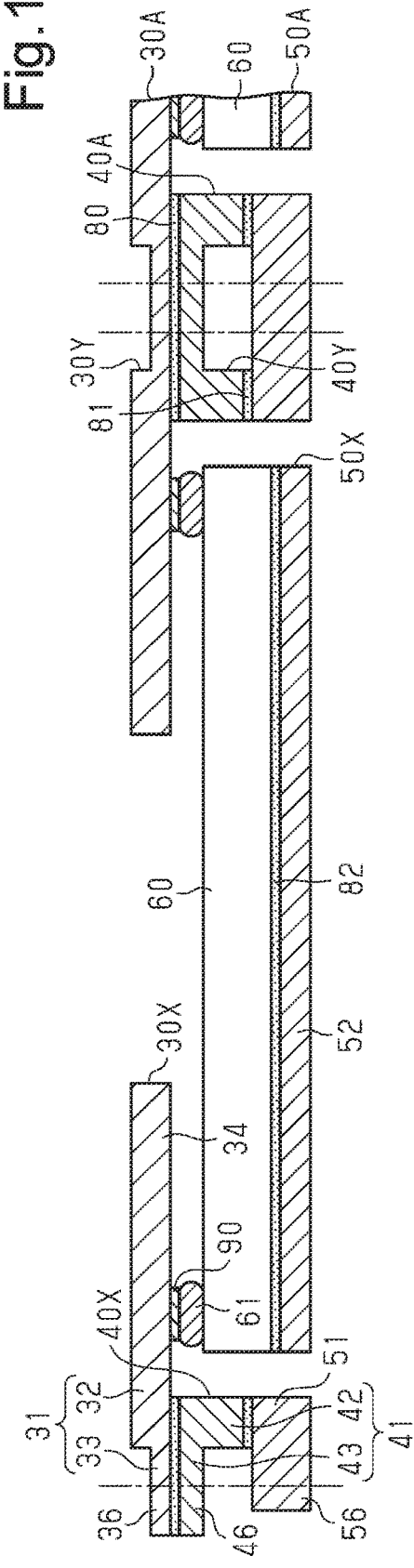

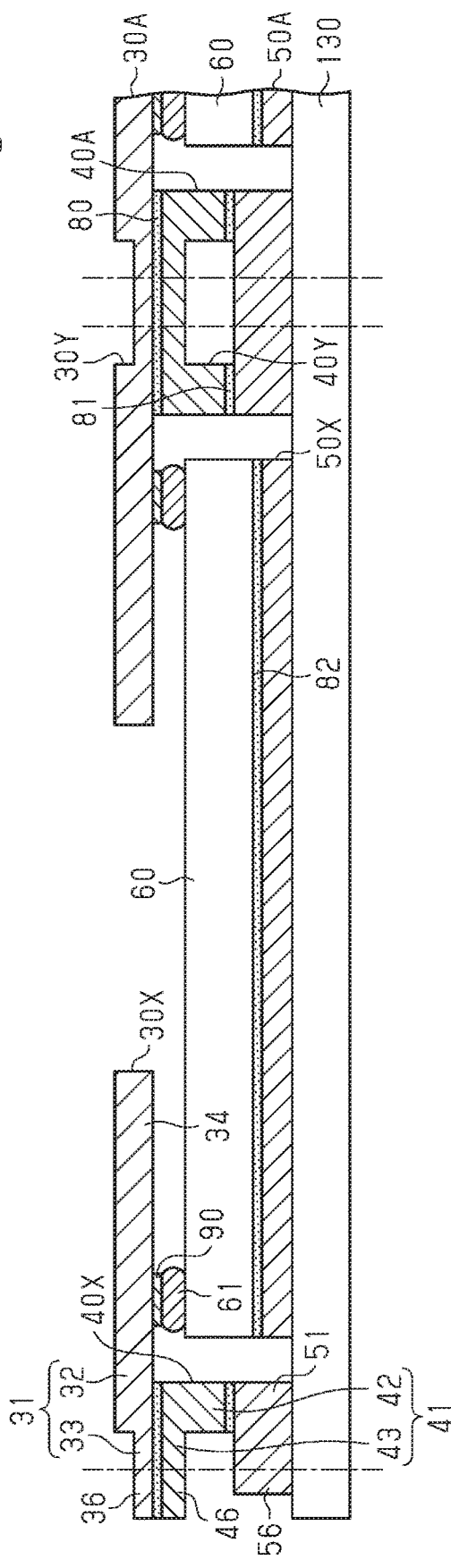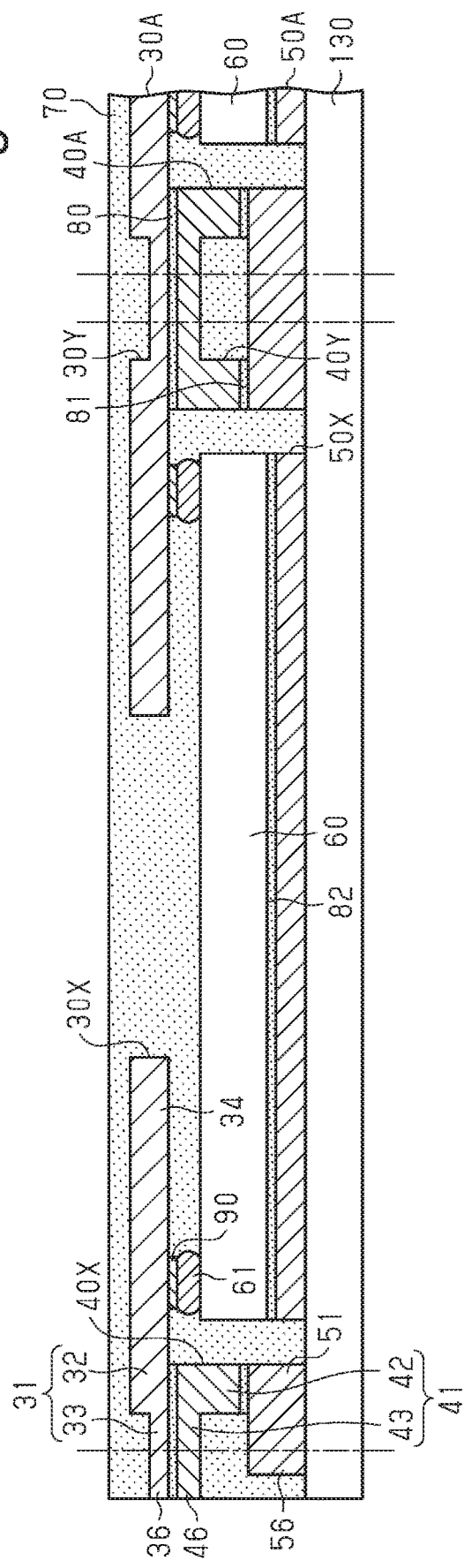

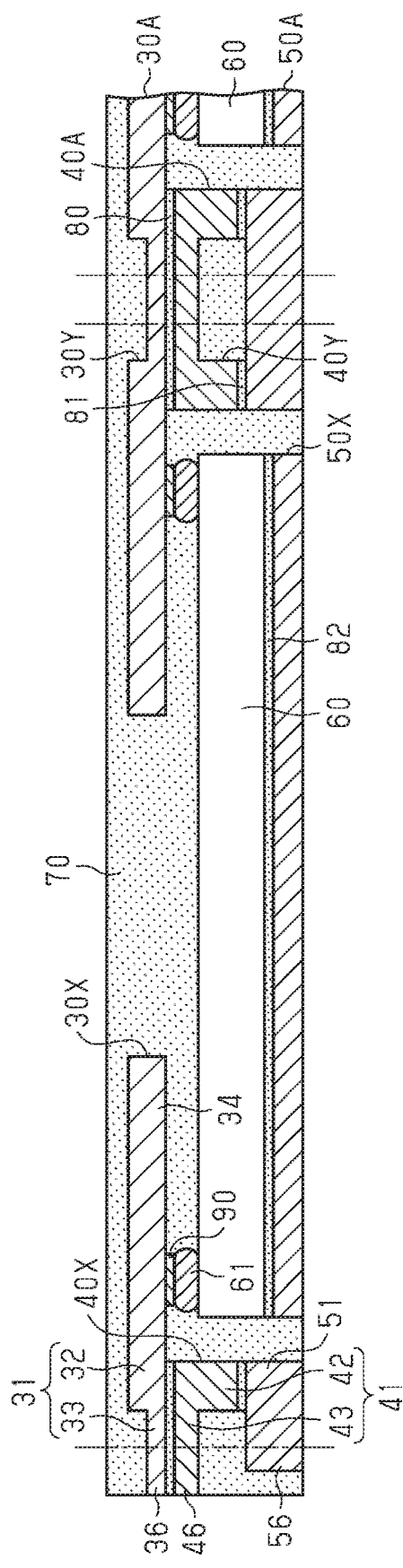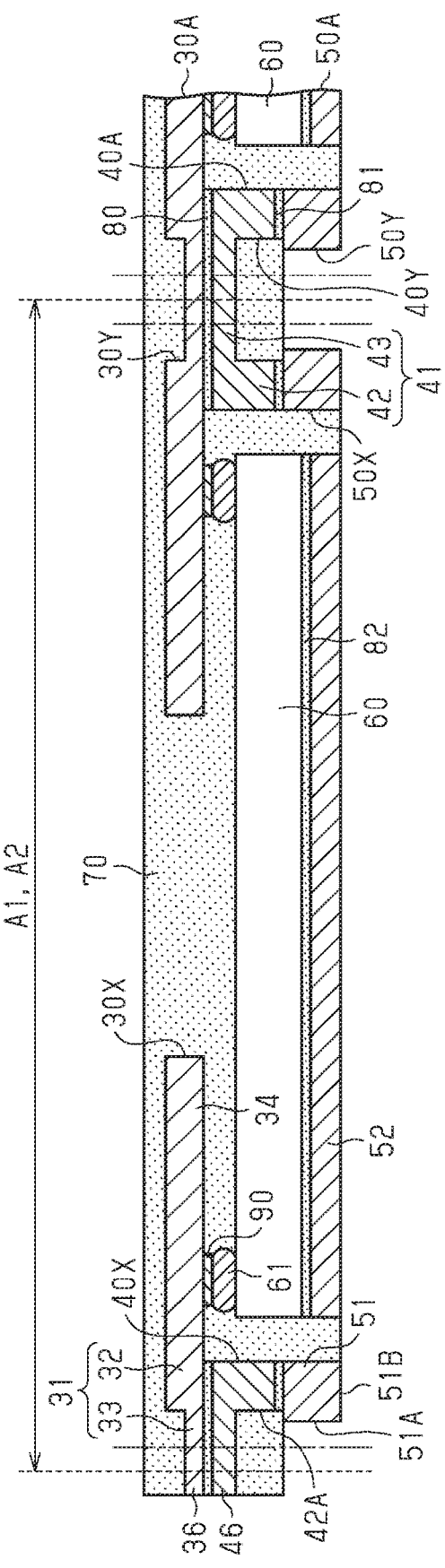

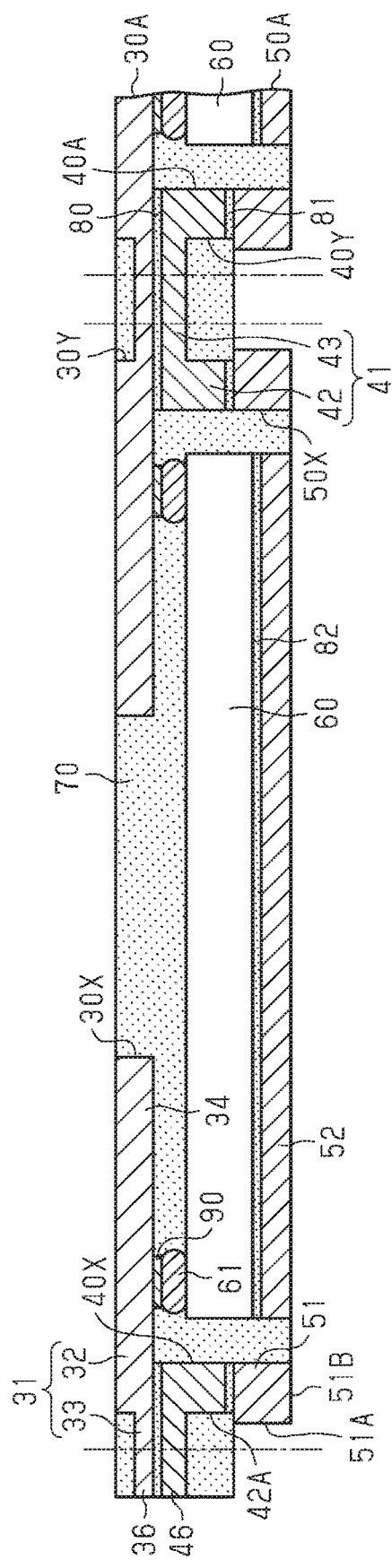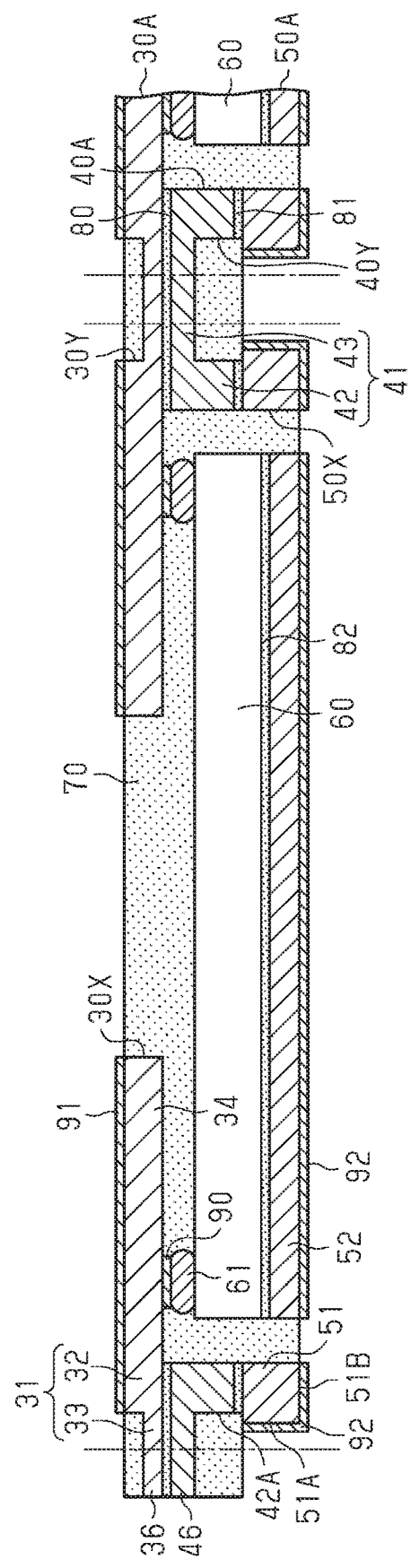

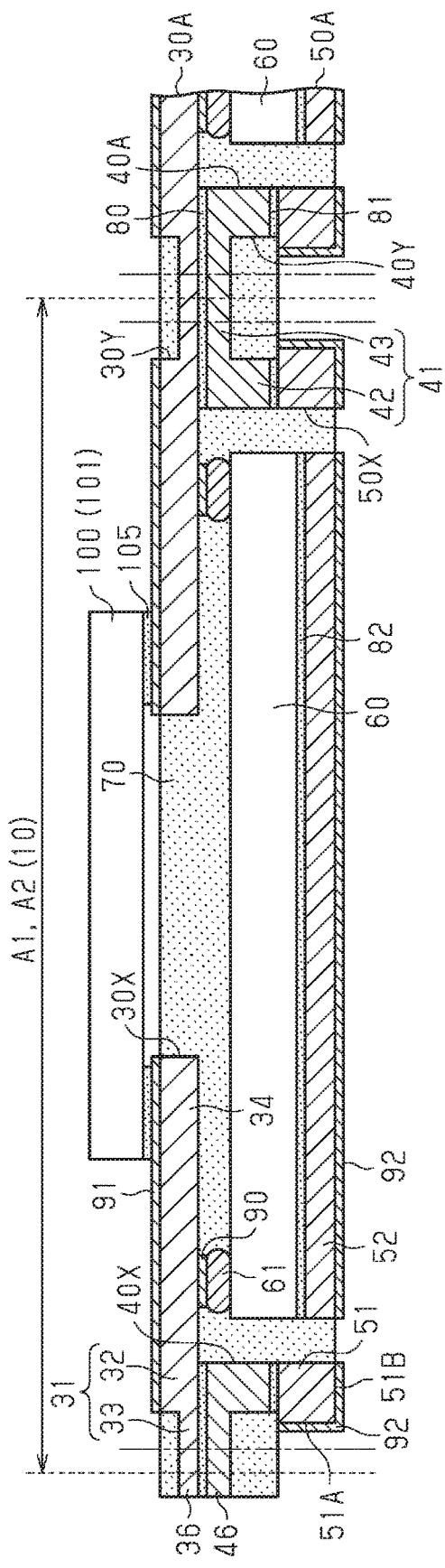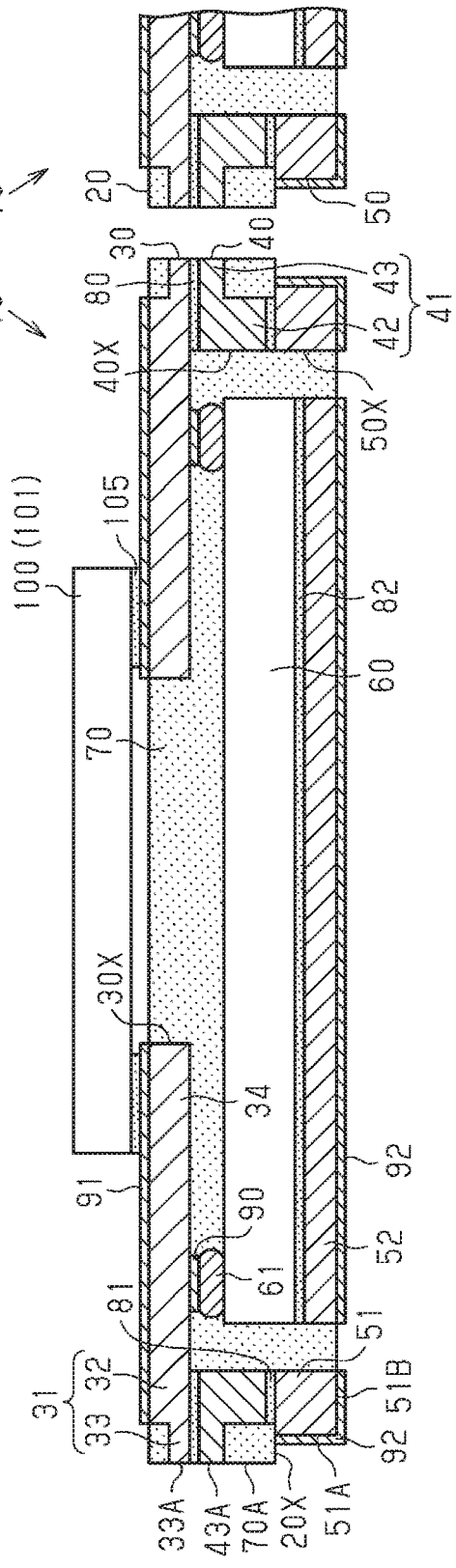

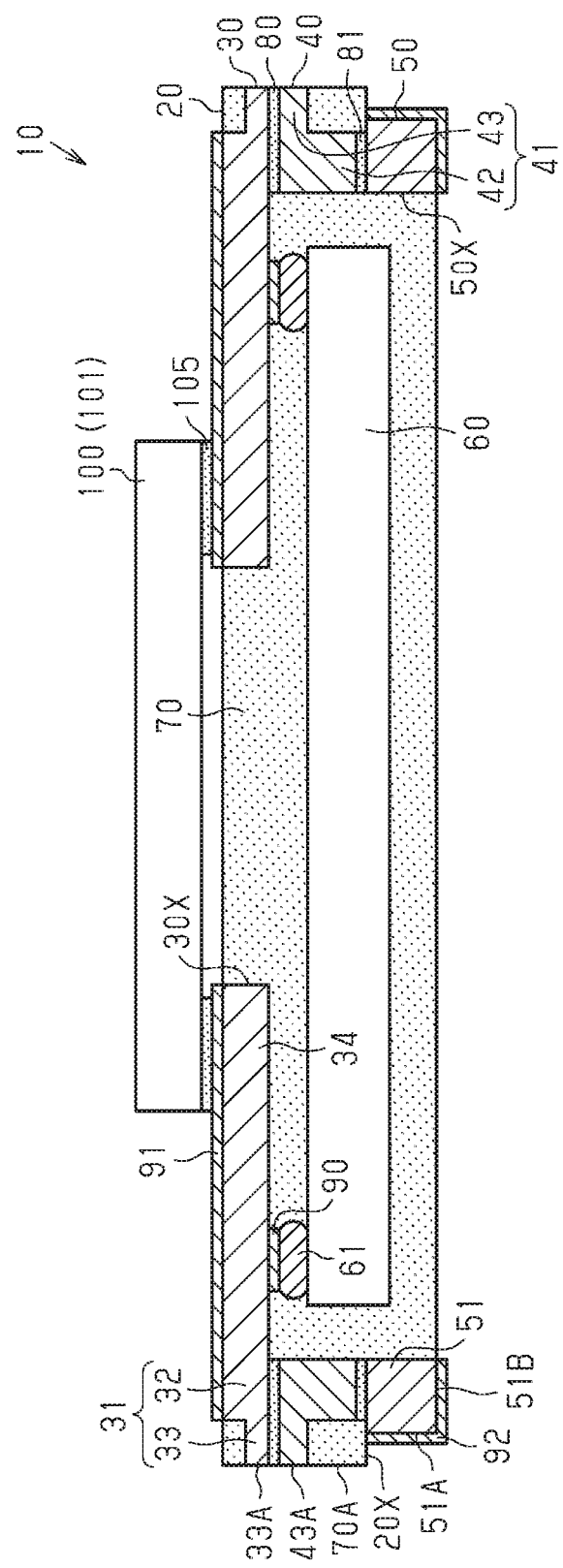

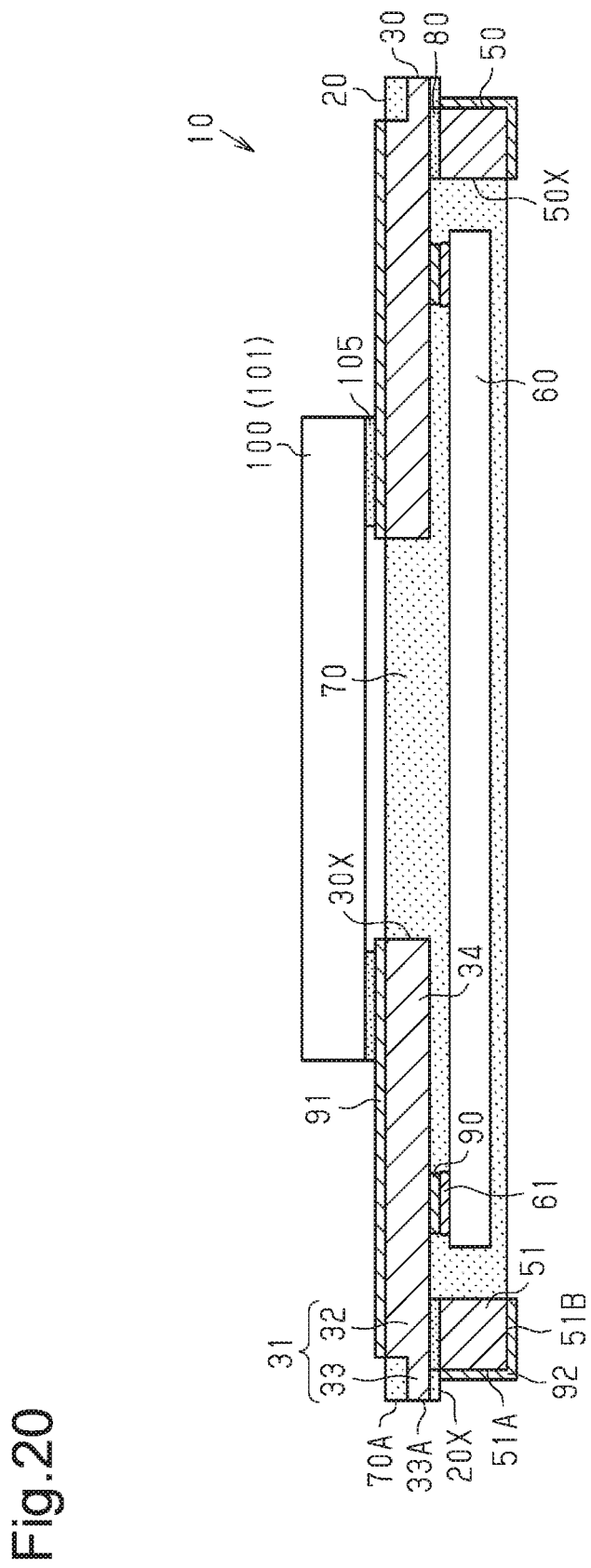

ELECTRONIC DEVICE

CROSS-REFERENCE TO RELATED APPLICATIONS

This application is based upon and claims the benefit of priority from prior Japanese Patent Application No. 2019-022447, filed on Feb. 12, 2019, the entire contents of which are incorporated herein by reference.

FIELD

This disclosure relates to an electronic device and a method for manufacturing an electronic device.

BACKGROUND

An electronic device including a substrate on which multiple electronic components are mounted is known in the art. In an electronic device of this type, a lead frame is used as the substrate, and multiple electronic components are mounted on the lead frame (refer to International Patent Publication No. WO2016/076162).

SUMMARY

In the electronic device of the related art described above, the electronic components are arranged next to one another on the lead frame. This results in an increase in the size of the electronic device in plan view.

An embodiment of an electronic device includes a first metal plate including a first wiring and a second wiring, an electronic component mounted on a lower surface of the first wiring so as to overlap the second wiring in plan view, a second metal plate including an electrode electrically connected to the lower surface of the first wiring, and an insulation layer filling a space between the first metal plate, the second metal plate, and the electronic component and covering the electronic component. The upper surface of the second wiring is exposed from the insulation layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 7A is a schematic plan view illustrating a method for manufacturing an embodiment of an electronic device;

FIG. 7B is a schematic partial cross-sectional view taken along line 7b-7b in FIG. 7A;

FIG. 10A is a schematic plan view illustrating a method for manufacturing the electronic device illustrated in FIG. 1;

FIG. 10B is a schematic partial cross-sectional view taken along line 10b-10b in FIG. 10A;

FIG. 11A is a schematic plan view illustrating a method for manufacturing the electronic device illustrated in FIG. 1;

FIG. 11B is a schematic partial cross-sectional view taken along line 11b-11b in FIG. 11A;

FIG. 12A is a schematic plan view illustrating a method for manufacturing the electronic device illustrated in FIG. 1;

FIG. 12B is a schematic partial cross-sectional view taken along line 12b-12b in FIG. 12A;

FIGS. 13A, 13B, 14A, 14B, 15A, 15B, 16A, 16B, 17A, and 17B are schematic cross-sectional views illustrating a method for manufacturing an embodiment of an electronic device; and FIGS. 18, 19, and 20 are schematic cross-sectional views illustrating various modified examples of electronic devices.

DESCRIPTION OF THE EMBODIMENTS

Figure 1:
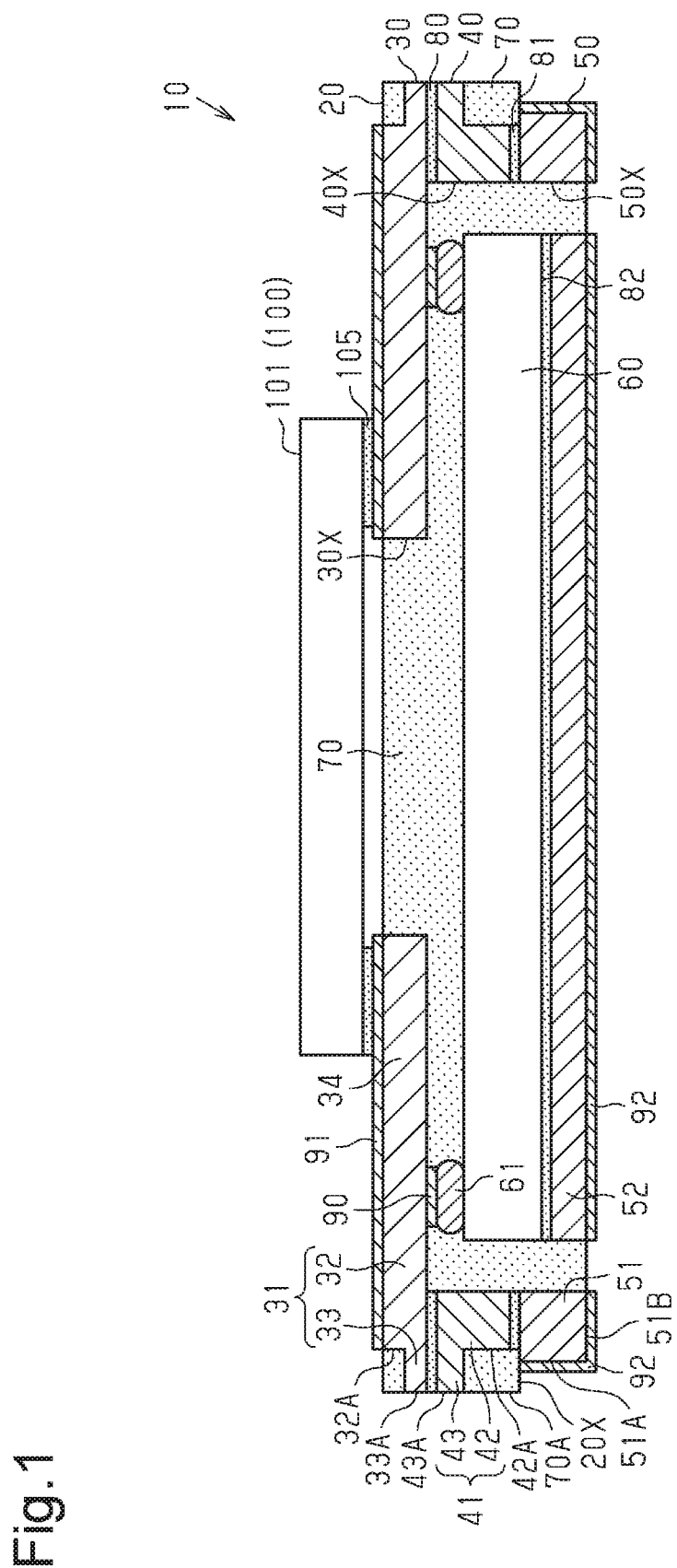
FIG. 1 is a schematic cross-sectional view of an embodiment of an electronic device taken along line 1-1 in FIGS. 2 to 5.

An embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

The structure of an electronic device 10 will now be described with reference to FIGS. 1 to 5.

As illustrated in FIG. 1, the electronic device 10 includes a substrate 20 and one or more electronic components 100 (one electronic component in FIG. 1) mounted on the substrate 20. The substrate 20 includes a metal plate 30, a metal plate 40 joined to the lower surface of the metal plate 30, a metal plate 50 joined to the lower surface of the metal plate 40, one or more electronic components 60 (one electronic component in FIG. 1) mounted on the lower surface of the metal plate 30, and an insulation layer 70 formed in a space between the metal plates 30, 40, and 50 to cover the electronic component 60. That is, the substrate 20 incorporates the electronic component 60.

The substrate 20 is, for example, rectangular-box-shaped and is rectangular in plan view. The dimensions of the substrate 20 may be, for example, approximately 4 mm×4 mm to 10 mm×10 mm in plan view. The thickness of the substrate 20 may be, for example, approximately 0.4 mm to 1.1 mm. In this specification, "plan view" refers to a view of a subject taken in a normal direction of the upper surface of the metal plate 30, and "planar shape" refers to a shape of a subject taken in plan view.

The material of the metal plates 30, 40, and 50 may be, for example, copper (Cu) or a Cu alloy. The material of the metal plates 30, 40, and 50 may be, for example, an iron-nickel (Fe—Ni) alloy such as Alloy 42. The metal plates 30, 40, and 50 may have the same material or different materials. The thickness of the metal plate 30 may be, for example, approximately 0.1 mm to 0.3 mm. The thickness of the metal plate 40 may be, for example, approximately 0.2 mm to 0.5 mm. The thickness of the metal plate 50 may be, for example, approximately 0.1 mm to 0.3 mm. The metal plates 30, 40, and 50 may have the same thickness or different thicknesses.

The material of the insulation layer 70 may be, for example, an insulative resin such as polyimide resin or epoxy resin, or a resin material obtained by mixing the insulative resin with a filler such as silica or alumina. The thickness of the insulation layer 70 from the lower surface to the upper surface of the insulation layer 70 may be, for example, approximately 0.4 mm to 1.1 mm.

The structure of the metal plate 30 will now be described with reference to FIGS. 1 to 3.

Figure 2:
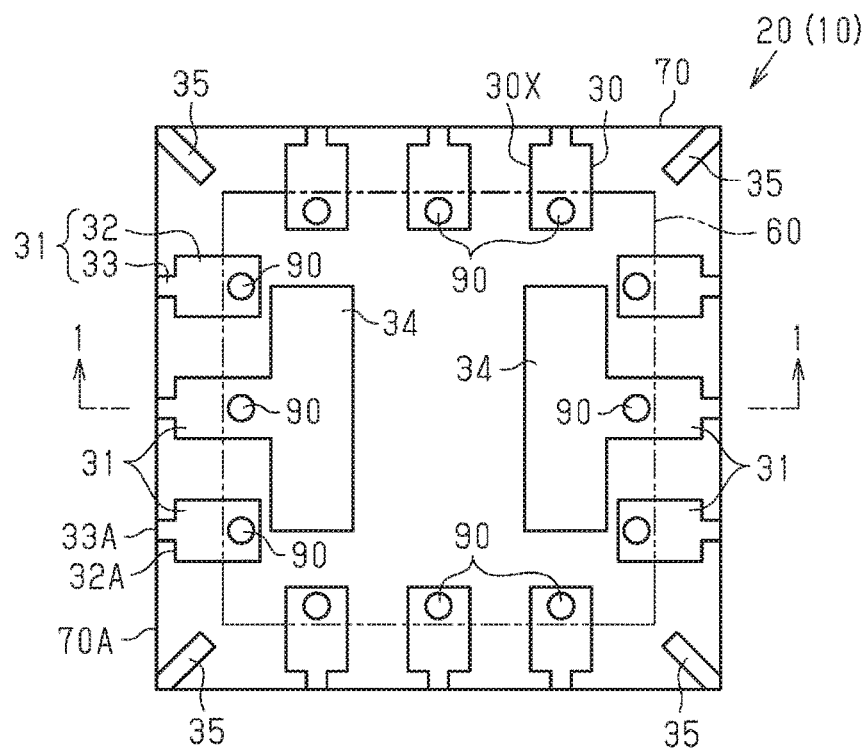
FIG. 2 is a schematic plan view of a metal plate and an insulation layer of the electronic device illustrated in FIG. 1 as viewed from a lower side.
Figure 3:
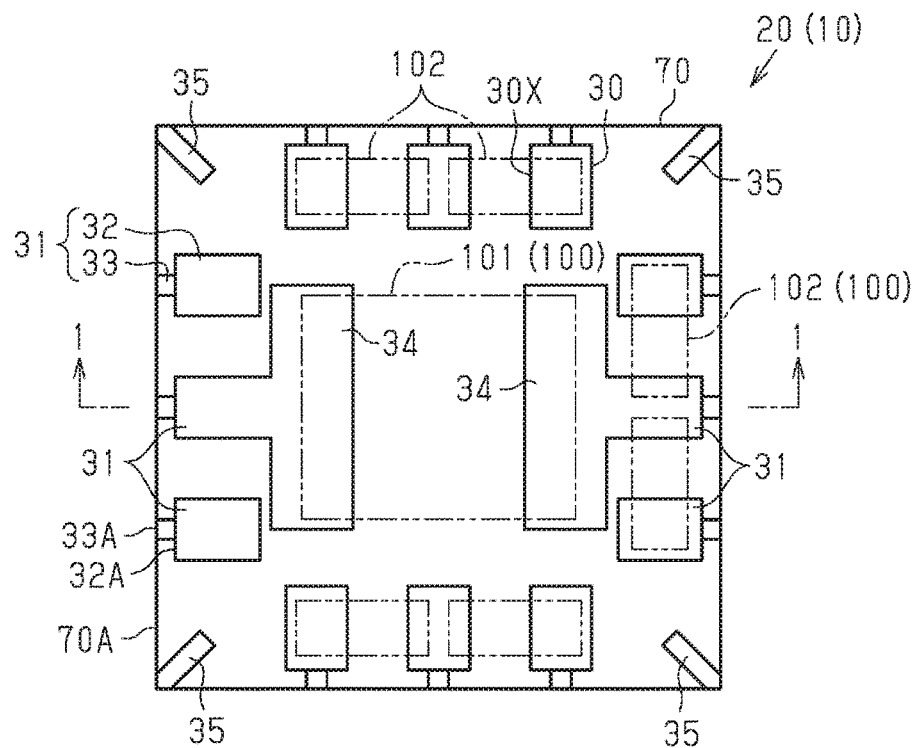
FIG. 3 is a schematic plan view of the metal plate and the insulation layer of the electronic device illustrated in FIG. 1 as viewed from an upper side.

As illustrated in FIGS. 2 and 3, the metal plate 30 includes multiple wirings 31, multiple wirings 34, and multiple power feeding portions 35. The wirings 31, the wirings 34, and the power feeding portions 35 are, for example, formed on the same plane. The metal plate 30 includes an opening 30X extending through the metal plate 30 in the thickness-wise direction to define the wirings 31, the wirings 34, and the power feeding portions 35. FIG. 2 is a plan view of the metal plate 30 and the insulation layer 70 from a lower side. FIG. 3 is a plan view of the metal plate 30 and the insulation layer 70 taken from an upper side.

The wirings 31 are spaced apart from each other. The wirings 31 are arranged, for example, in a peripheral region of the electronic device 10 (metal plate 30 of substrate 20). For example, the wirings 31 are arranged at given intervals along peripheral edges of the metal plate 30. In the present example, three wirings 31 are arranged at given intervals along each of the four sides defining the contour of the substrate 20.

Each of the wirings 31 includes, for example, a body 32 and a projection 33. The body 32 is, for example, rectangular-box-shaped and includes an upper surface, a lower surface, and side surfaces. The projection 33 projects from a side surface 32A, which is one of the side surfaces of the body 32 located toward the peripheral edge of the electronic device 10 (metal plate 30), toward the peripheral edge of the electronic device 10 (metal plate 30). The projection 33 is, for example, rectangular-box-shaped and includes an upper surface, a lower surface, and side surfaces. The projection 33 has, for example, a smaller width-wise dimension than the body 32. In this specification, "width-wise dimension" of each member refers to a dimension extending in a peripheral direction of the electronic device 10, that is, a direction extending around outer side surfaces of the electronic device 10 (substrate 20).

As illustrated in FIG. 1, the projection 33 has, for example, a smaller thickness than the body 32. The thickness of the projection 33 may be, for example, approximately 0.3 times to 0.7 times the thickness of the body 32. The upper surface of the body 32 is recessed toward the metal plate 40 to define the projection 33. The lower surface of the projection 33 is substantially flush with the lower surface of the body 32. The upper surface of the projection 33 is located at a lower position than the upper surface of the body 32. The upper surface of the projection 33 is covered with the insulation layer 70. The insulation layer 70 covers, for example, the side surface 32A of the body 32.

The projection 33 includes an outer side surface 33A (i.e., distal surface) located on the peripheral edge of the electronic device 10 (metal plate 30). The outer side surface 33A of the projection 33 is exposed from an outer side surface 70A of the insulation layer 70. The outer side surface 33A of the projection 33 is, for example, substantially flush with the outer side surface 70A of the insulation layer 70. The outer side surface 33A of the projection 33 exposed from the insulation layer 70 has a smaller area than the side surface 32A of the body 32. In the present example, the projection 33 has a smaller width-wise dimension and a smaller thickness than the body 32, so that the outer side surface 33A exposed from the insulation layer 70 has a smaller area than the side surface 32A of the body 32.

The wirings 31 are provided as wirings for mounting, for example, the electronic component 60. At least some of the wirings 31 are provided as wirings for mounting, for example, the electronic component 100. For example, the upper surface of each wiring 31 may be used as a mount surface for the electronic component 100. The lower surface of the wiring 31 may be used as a mount surface for the electronic component 60.

Metal films 90 are formed on the lower surface of the wiring 31. The metal films 90 are arranged, for example, on the lower surface of the body 32. The metal films 90 are arranged corresponding to bumps 61 of the electronic component 60. When the electronic component 60 is mounted on the metal plate 30, the metal films 90 face the bumps 61 of the electronic components 60. As illustrated in FIG. 2, the metal films 90 are arranged, for example, along peripheral edges of the electronic component 60. Each metal film 90 is formed, for example, on a portion of the lower surface of the corresponding body 32. The metal film 90 is, for example, circular in plan view.

The metal films 90 may be a gold (Au) layer, a nickel (Ni) layer/Au layer (metal layer in which Ni layer is used as bottom layer, and Au layer is arranged on Ni layer), a Ni layer/palladium (Pd) layer/Au layer (metal layer in which Ni layer is used as bottom layer, and Ni layer, Pd layer, and Au layer are sequentially stacked), or a Ni layer/silver (Ag) layer (metal layer in which Ni layer is used as bottom layer, and Ag layer is arranged on Ni layer). The Au layer is a metal layer formed with Au or an Au alloy. The Ni layer is a metal layer formed with Ni or a Ni alloy. The Pd layer is a metal layer formed with Pd or a Pd alloy. The Ag layer is a metal layer formed with Ag or a Ag alloy. Each of the Au layer, the Ni layer, the Pd layer, and the Ag layer may be, for example, an electrolytic plated metal layer formed through an electrolytic plating process.

As illustrated in FIGS. 2 and 3, the wirings 34 are arranged at an inner side of the substrate 20 in relation to the wirings 31 in plan view. For example, the wirings 34 project from some of the wirings 31 toward the inner side of the substrate 20 in plan view. In the present example, each wiring 34 projects toward the inner side of the substrate 20 from a side surface of the body 32 that is opposite to the side surface 32A. The wiring 34 has, for example, a larger width-wise dimension than the wiring 31. The wiring 34 is formed, for example, continuously and integrally with the corresponding one of the wirings 31. The wiring 34 is provided as a wiring for mounting the electronic component 100.

As illustrated in FIG. 1, for example, the wiring 34 and the body 32 of the wiring 31 have the same thickness. The upper surface of the wiring 34 is substantially flush with the upper surface of the body 32. The lower surface of the wiring 34 is substantially flush with the lower surface of the body 32.

The upper surface of the body 32 of the wiring 31 and the upper surface of the wiring 34 are exposed from the upper surface of the insulation layer 70. The upper surface of the body 32 and the upper surface of the wirings 34 are, for example, substantially flush with the upper surface of the insulation layer 70. The upper surfaces of the wirings 31 and 34 exposed from the insulation layer 70 are used as electronic component mount pads that are electrically connected to the electronic component 100.

A metal film 91 is formed on the upper surface of the body 32 and the upper surface of the wiring 34. The metal film 91 covers, for example, the entire upper surface of the body 32 and the entire upper surface of the wiring 34. That is, the metal film 91 covers the entirety of the upper surfaces of the wirings 31 and 34 exposed from the insulation layer 70. Examples of the metal film 91 include a Au layer, a Ni layer/Au layer, a Ni layer/Pd layer/Au layer, and a Ni layer/Ag layer. Instead of using the metal film 91, for example, an anti-oxidation process such as an organic solderability preservative (OSP) process may be performed on the upper surfaces of the wirings 31 and 34 to form an OSP film. The OSP film may be a coating of an organic compound such as an azole compound or an imidazole compound.

As illustrated in FIGS. 2 and 3, the power feeding portions 35 are arranged, for example, on corners (four corners in the present example) of the substrate 20. Each power feeding portion 35 extends, for example, from the corresponding corner of the substrate 20 along a diagonal line of the substrate 20. The power feeding portion 35 is, for example, spaced apart from the wirings 31 and 34 and electrically insulated from the wirings 31 and 34.

Each power feeding portion 35 includes outer side surfaces located on the peripheral edge of the electronic device 10 (metal plate 30). For example, the outer side surfaces of the power feeding portion 35 are exposed from the outer side surfaces 70A of the insulation layer 70 and substantially flush with the outer side surfaces 70A of the insulation layer 70. The power feeding portion 35 and the body 32 of the wiring 31 have, for example, the same thickness.

The electronic component 60 will now be described.

As illustrated in FIG. 1, the electronic component 60 is mounted on the lower surface of the metal plate 30. The electronic component 60 is mounted, for example, on the lower surfaces of the bodies 32 of the wirings 31 so as to overlap the wirings 34 in plan view. The electronic component 60 may be, for example, a semiconductor chip, an active component such as a transistor or a diode, or a passive component such as a chip capacitor, a chip inductor, or a chip resistor. In addition, the electronic component 60 may be, for example, a silicon component or a ceramic component. In the present example, the electronic component 60 is a semiconductor chip. The semiconductor chip may be, for example, a logic chip such as a central processing unit (CPU) chip or a graphics processing unit (GPU) chip. The semiconductor chip may be, for example, a memory chip such as a dynamic random access memory (DRAM) chip, a static random access memory (SRAM) chip, or a flash memory chip.

In the present example, the electronic component 60 is flip-chip mounted on the lower surfaces of the wirings 31. For example, the bumps 61 are arranged on a circuit formation surface (upper surface in FIG. 1) of the electronic component 60 and joined to the metal films 90, which are formed on the lower surfaces of the wirings 31. The bumps 61 are formed on the terminals arranged in the circuit formation surface of the electronic component 60. Thus, the electronic component 60 is electrically connected to the wirings 31 through the bumps 61 and the metal films 90.

The structure of the metal plate 40 will now be described with reference to FIGS. 1 and 4.

As illustrated in FIG. 1, the upper surface of the metal plate 40 is joined to the lower surface of the metal plate 30. The upper surface of the metal plate 40 is joined to the lower surface of the metal plate 30, for example, with a conductive joint material 80. The joint material 80 may be, for example, solder, a conductive paste such as a silver paste, or a brazing metal. Solder may be, for example, a lead (Pd)-free solder. Examples of lead-free solder include a Sn—Ag base, a Sn—Cu base, a Sn—Ag—Cu base, or a Sn—Zn (zinc)-Bi (bismuth) base solder.

Figure 4:
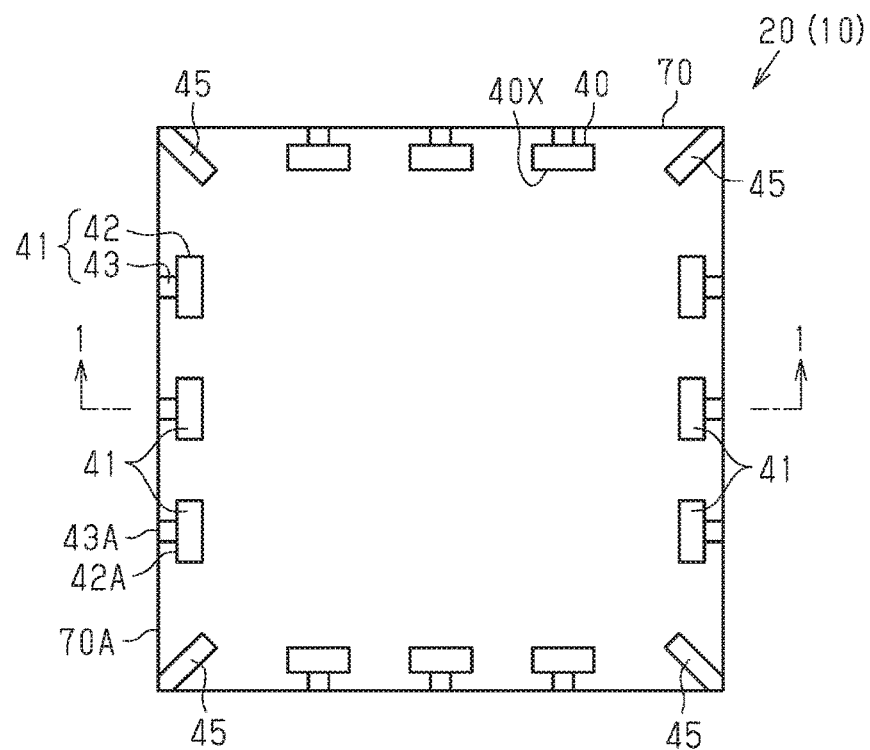
FIG. 4 is a schematic plan view of another metal plate and the insulation layer of the electronic device illustrated in FIG. 1 as viewed from a lower side.

As illustrated in FIG. 4, the metal plate 40 includes multiple wirings 41 and multiple power feeding portions 45. The wirings 41 and the power feeding portions 45 are, for example, formed on the same plane. The metal plate 40 includes an opening 40X extending through the metal plate 40 in the thickness-wise direction to define the wirings 41 and the power feeding portions 45. FIG. 4 is a plan view of the metal plate 40 and the insulation layer 70 from a lower side.

The wirings 41 are spaced apart from each other. The wirings 41 are formed in a peripheral region of the electronic device 10 (metal plate 40 of substrate 20). For example, the wirings 41 are arranged at given intervals along peripheral edges of the metal plate 40. In the present example, three wirings 41 are arranged at given intervals along each of the four sides defining the contour of the substrate 20. As illustrated in FIGS. 1, 2, and 4, each wiring 41 is arranged at a position overlapping a portion of the corresponding wiring 31 in plan view. The wiring 41 overlaps, for example, a portion of the corresponding wiring 31 located outside the mount region of the electronic component 60 in plan view.

As illustrated in FIG. 4, each wiring 41 includes, for example, a body 42 and a projection 43. The body 42 is, for example, rectangular-box-shaped and includes an upper surface, a lower surface, and side surfaces. The projection 43 projects from a side surface 42A, which is one of the side surfaces of the body 42 located toward the peripheral edge of the electronic device 10 (metal plate 40), toward the peripheral edge of the electronic device 10 (metal plate 40). The projection 43 is, for example, rectangular-box-shaped and includes an upper surface, a lower surface, and side surfaces. The projection 43 has, for example, a smaller width-wise dimension than the body 42.

As illustrated in FIG. 1, the projection 43 has, for example, a smaller thickness than the body 42. The thickness of the projection 43 may be, for example, approximately 0.3 times to 0.7 times the thickness of the body 42. The lower surface of the body 42 is recessed toward the metal plate 30 to define the projection 43. The upper surface of the projection 43 is substantially flush with the upper surface of the body 42. The lower surface of the projection 43 is located at a higher position than the lower surface of the body 42.

The upper surface of the wiring 41 is joined to the lower surface of the wiring 31. The upper surface of the wiring 41 is joined to the lower surface of the wiring 31, for example, with the joint material 80. Each body 42 overlaps a portion of the corresponding body 32 in plan view. In addition, each projection 43 overlaps the corresponding projection 33 in plan view. Thus, for example, the upper surface of each body 42 is joined to the lower surface of the corresponding body 32 with the corresponding portion of the joint material 80.

The upper surface of each projection 43 is joined to the lower surface of the corresponding projection 33 with the corresponding portion of the joint material 80. The joint material 80 covers, for example, the entire upper surface of the wiring 41.

The lower surface of the projection 43 is covered with the insulation layer 70. The insulation layer 70 covers, for example, the side surface 42A of the body 42.

The projection 43 includes an outer side surface 43A (i.e., distal surface) located on the peripheral edge of the electronic device 10 (metal plate 40). The outer side surface 43A of the projection 43 is exposed from the outer side surface 70A of the insulation layer 70. The outer side surface 43A of the projection 43 is, for example, substantially flush with the outer side surface 70A of the insulation layer 70 and the outer side surface 33A of the projection 33. The outer side surface 43A of the projection 43 exposed from the insulation layer 70 has a smaller area than the side surface 42A of the body 42. In the present example, the projection 43 has a smaller width-wise dimension and a smaller thickness than the body 42, so that the outer side surface 43A exposed from the insulation layer 70 has a smaller area than the side surface 42A of the body 42.

As illustrated in FIG. 4, the power feeding portions 45 are arranged, for example, on corners (four corners in the present example) of the substrate 20. Each power feeding portion 45 extends, for example, from the corresponding corner of the substrate 20 along a diagonal line of the substrate 20. The power feeding portion 45 is, for example, spaced apart from the wirings 41 and electrically insulated from the wirings 41. The power feeding portion 45 and the body 42 of the wiring 41 have the same thickness. The power feeding portions 45 are arranged at positions overlapping the power feeding portions 35 (refer to FIG. 2) in plan view. Although not illustrated in detail, the upper surfaces of the power feeding portions 45 are joined to, for example, the lower surfaces of the power feeding portions 35 (refer to FIG. 2) with the joint material 80 (refer to FIG. 1).

Each power feeding portion 45 includes outer side surfaces located on the peripheral edge of the electronic device 10 (metal plate 40). For example, the outer side surfaces of the power feeding portion 45 are exposed from the outer side surfaces 70A of the insulation layer 70 and substantially flush with the outer side surfaces 70A of the insulation layer 70.

The structure of the metal plate 50 will now be described with reference to FIGS. 1 and 5.

As illustrated in FIG. 1, the upper surface of the metal plate 50 is joined to the lower surface of the metal plate 40. The upper surface of the metal plate 50 is joined to the lower surface of the metal plate 40, for example, with a conductive joint material 81. The joint material 81 may be, for example, solder, a conductive paste such as a silver paste, or a brazing metal. Solder may be, for example, a lead-free solder. Examples of lead-free solder include a Sn—Ag base, a Sn—Cu base, a Sn—Ag—Cu base, or a Sn—Zn—Bi base solder.

Figure 5:
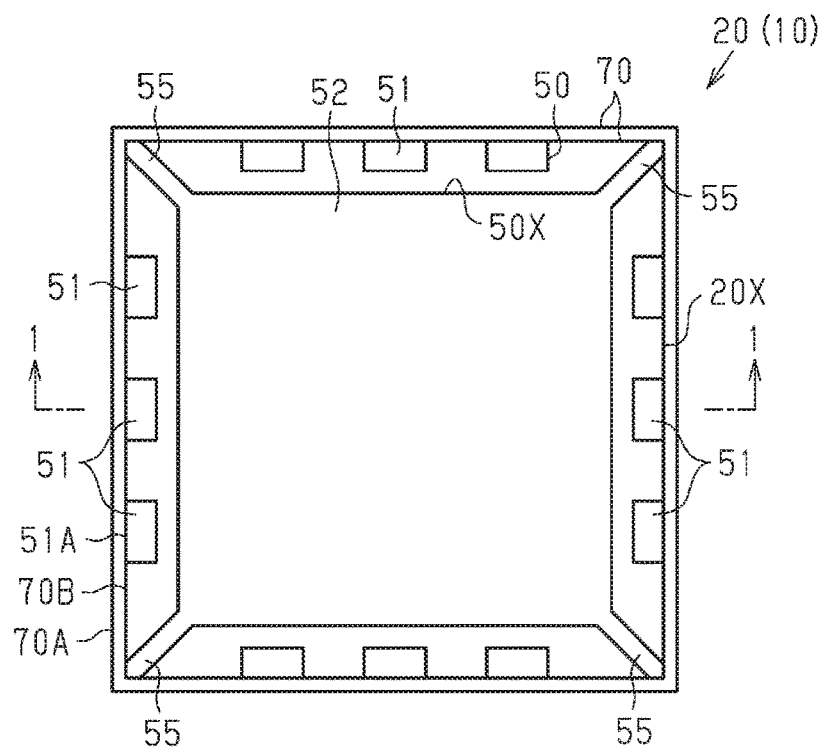
FIG. 5 is a schematic plan view of another metal plate and the insulation layer of the electronic device illustrated in FIG. 1 as viewed from a lower side.

As illustrated in FIG. 5, the metal plate 50 includes multiple electrodes 51, a heat dissipation plate 52, and multiple power feeding portions 55. The electrodes 51, the heat dissipation plate 52, and the power feeding portions 55 are, for example, formed on the same plane. The metal plate 50 includes openings 50X extending through the metal plate 50 in the thickness-wise direction to define the electrodes 51, the heat dissipation plate 52, and the power feeding portions 55. FIG. 5 is a plan view of the metal plate 50 and the insulation layer 70 from a lower side.

The electrodes 51 are spaced apart from each other. The electrodes 51 are formed in a peripheral region of the electronic device 10 (metal plate 50 of substrate 20). For example, the electrodes 51 are arranged at given intervals along peripheral edges of the metal plate 50. In the present example, three electrodes 51 are arranged at given intervals along each of the four sides defining the contour of the substrate 20. Each electrode 51 is, for example, rectangular-box-shaped.

As illustrated in FIGS. 1, 2, 4, and 5, each electrode 51 is arranged at a position overlapping a portion of the corresponding wiring 31 and a portion of the corresponding wiring 41 in plan view. The electrode 51 overlaps, for example, a portion of the corresponding wirings 31 and 41 located outside the mount region of the electronic component 60 in plan view. The electrode 51 is joined to the lower surface of the wiring 41. For example, the upper surface of the electrode 51 is joined to the lower surface of the body 42 of the wiring 41 with the joint material 81. In the present example, the electrodes 51 are electrically connected to the wirings 31 through the wirings 41. In other words, the wirings 41 are used as link terminals that connect the wirings 31 to the electrodes 51. The joint material 81 covers, for example, the entire lower surface of the body 42 of the wiring 41.

Each electrode 51 includes an outer side surface 51A located on the peripheral edge of the electronic device 10 (metal plate 50). The outer side surface 51A of the electrode 51 is, for example, exposed from the outer side surface 70A of the insulation layer 70. The outer side surface 70A of the insulation layer 70 is flush with the outer side surfaces 33A and 43A of the projections 33 and 43, which correspond to the peripheral edges of the metal plates 30 and 40. Therefore, the outer side surface 51A of the electrode 51 is located at an inner side of the electronic device 10 (substrate 20) in relation to the outer side surface 70A of the insulation layer 70 (outer side surfaces 33A and 43A of projections 33 and 43) in plan view. Thus, the outer side surface 70A of the insulation layer 70 and the outer side surface 51A of the electrodes 51 form a step 20X in the outer side surfaces of the substrate 20. The term "flush with" as used in this disclosure may include "substantially flush with".

As illustrated in FIG. 5, the step 20X continuously extends, for example, around the entire perimeter of the substrate 20. The insulation layer 70 covers the side surfaces of the electrodes 51 excluding the outer side surfaces 51A. The insulation layer 70 includes outer side surfaces 70B located in the same layer as the outer side surfaces 51A of the electrodes 51. The outer side surfaces 70B are located at an inner side of the substrate 20 in relation to the outer side surfaces 70A in plan view. In the present example, the outer side surfaces 70B of the insulation layer 70 are substantially flush with the outer side surfaces 51A of the electrodes 51.

As illustrated in FIG. 1, the outer side surface 51A of the electrode 51 is, for example, located closer to the peripheral edge of the substrate 20 than the side surface 42A of the body 42 in plan view. The electrode 51 covers a portion of the lower surface of the insulation layer 70 that covers the side surface 42A of the body 42.

The electrode 51 has a lower surface 51B exposed from the lower surface of the insulation layer 70. The lower surface 51B of the electrode 51 is, for example, substantially flush with the lower surface of the insulation layer 70.

A metal film 92 is formed on the outer side surface 51A and the lower surface 51B of the electrode 51 exposed from the insulation layer 70. The metal film 92 covers, for example, the entire outer side surface 51A and the entire lower surface 51B of the electrode 51. The metal film 92, for example, continuously covers the outer side surface 51A and the lower surface 51B of the electrode 51. The side surface of the metal film 92 is located at an inner side of the substrate 20, for example, in relation to the outer side surface 70A of the insulation layer 70 in plan view. Examples of the metal film 92 include a Au layer, a Ni layer/Au layer, a Ni layer/Pd layer/Au layer, and a Ni layer/Ag layer. Instead of using the metal film 92, for example, an anti-oxidation process such as an OSP process may be performed on the outer side surface 51A and the lower surface 51B of the electrode 51 to form an OSP film. The OSP film may be a coating of an organic compound such as an azole compound or an imidazole compound.

The heat dissipation plate 52 is located at an inner side of the substrate 20 in relation to the electrodes 51 in plan view. The heat dissipation plate 52 is arranged, for example, at a position overlapping the electronic component 60 in plan view. The heat dissipation plate 52 is, for example, rectangular in plan view. The heat dissipation plate 52 is the same in size as, for example, the electronic component 60 in plan view.

The heat dissipation plate 52 has, for example, a smaller thickness than the electrode 51. The thickness of the heat dissipation plate 52 may be, for example, approximately 0.3 times to 0.7 times the thickness of the electrode 51. The upper surface of the electrode 51 is recessed downward to define the heat dissipation plate 52. The lower surface of the heat dissipation plate 52 is coplanar with the lower surface of the electrode 51. The upper surface of the heat dissipation plate 52 is located at a lower position than the upper surface of the electrode 51.

The heat dissipation plate 52 is, for example, thermally connected to the electronic component 60. The upper surface of the heat dissipation plate 52 is, for example, joined to a rear surface (lower surface in FIG. 1) of the electronic component 60 with an adhesive layer 82. The adhesive layer 82 may be, for example, an epoxy-based, polyimide-based, or silicone-based thermosetting adhesive or a thermal interface material (TIM). The material of the thermal interface material may be a soft metal such as indium (In) or silver, silicone gel, or an organic resin binder containing a metal filler or graphite. The adhesive layer 82 is used, for example, to adhere the electronic component 60 to the heat dissipation plate 52 and thermally connect the electronic component 60 to the heat dissipation plate 52. The thickness of the adhesive layer 82 may be, for example, approximately 20 to 50 μm.

The lower surface of the heat dissipation plate 52 is, for example, exposed from the lower surface of the insulation layer 70. The lower surface of the heat dissipation plate 52 is, for example, substantially flush with the lower surface of the insulation layer 70. For example, the metal film 92 is formed on the lower surface of the heat dissipation plate 52. The metal film 92 covers, for example, the entire lower surface of the heat dissipation plate 52.

As illustrated in FIG. 5, the power feeding portions 55 are arranged, for example, on corners (four corners in the present example) of the substrate 20. Each power feeding portion 55 extends, for example, from the corresponding corner of the substrate 20 along a diagonal line of the substrate 20. The power feeding portion 55 is formed, for example, continuously and integrally with the heat dissipation plate 52. The power feeding portions 55 are connected to, for example, corners (four corners in the present example) of the heat dissipation plate 52.

For example, most parts of the power feeding portions 55 have the same thickness as the electrodes 51. The power feeding portions 55 are arranged at positions overlapping the power feeding portions 45 (refer to FIG. 4) and the power feeding portions 35 (refer to FIG. 2) in plan view. Although not illustrated in detail, the upper surfaces of the power feeding portions 55 are joined to, for example, the lower surfaces of the power feeding portions 45 (refer to FIG. 4) with the joint material 81 (refer to FIG. 1).

Each power feeding portion 55 includes outer side surfaces located on the peripheral edge of the electronic device 10 (metal plate 50). For example, the outer side surfaces of the power feeding portion 55 are exposed from the outer side surfaces 70A and 70B of the insulation layer 70. The lower surface of the power feeding portion 55 is, for example, exposed from the lower surface of the insulation layer 70. The metal film 92 (refer to FIG. 1) is formed on the outer side surfaces of the power feeding portion 55 and the lower surface of the power feeding portion 55 to cover, for example, the entirety of the outer side surfaces and the entire lower surface.

As illustrated in FIG. 1, the insulation layer 70 fills space between the metal plates 30, 40, and 50 and space between the electronic component 60 and the metal plates 30, 40, and 50. The insulation layer 70 fills, for example, the openings 30X, 40X, and 50X in the metal plates 30, 40, and 50. In the present example, in the metal plate 30, the insulation layer 70 fills space between the wirings 31, between the wirings 34, between the power feeding portions 35 (refer to FIG. 2), and between the wiring 31, the wiring 34, and the power feeding portion 35. In addition, in the metal plate 40, the insulation layer 70 fills space between the wirings 41, between the power feeding portions 45 (refer to FIG. 4), and between the wiring 41 and the power feeding portion 45. In the metal plate 50, the insulation layer 70 fills space between the electrodes 51, between the power feeding portions 55 (refer to FIG. 5), and between the electrode 51, the heat dissipation plate 52, and the power feeding portion 55. The insulation layer 70, for example, entirely covers the electronic component 60.

As illustrated in FIG. 3, one or more (seven in the present example) of the electronic components 100 (indicated by double-dashed lines) are mounted on the upper surface of the metal plate 30. The electronic components 100 are mounted on, for example, the upper surfaces of the wirings 31 or the wirings 34. In the present example, the electronic components 100 include an electronic component 101 mounted on the upper surfaces of the wirings 34 and six electronic components 102 mounted on the upper surfaces of the wirings 31. The electronic components 101 and 102 may be, for example, a semiconductor chip, an active component such as a transistor or a diode, or a passive component such as a chip capacitor, a chip inductor, or a chip resistor. In addition, the electronic components 101 and 102 may be, for example, a silicon component or a ceramic component. In the present example, the electronic component 101 is a chip inductor, and the electronic components 102 are chip capacitors.

The electronic component 101 is mounted, for example, on the upper surfaces of two wirings 34 extending over the space (opening 30X) between the two wirings 34. As illustrated in FIG. 1, the electronic component 101 is mounted on, for example, the metal film 91 formed on the upper surfaces of the wirings 34. The electronic component 101 is joined to the metal film 91, for example, with a conductive joint material 105. Thus, the electronic component 101 is electrically connected to the wirings 34 through the joint material 105 and the metal film 91. Further, the electronic component 101 is electrically connected to the electronic component 60, for example, through the wirings 31 and 34 and the metal films 90. The electronic component 101 overlaps, for example, a portion of the electronic component 60 in plan view.

The joint material 105 may be, for example, solder, a conductive paste such as a silver paste, or a brazing metal. Solder may be, for example, a lead-free solder. Examples of lead-free solder include a Sn—Ag base, a Sn—Cu base, a Sn—Ag—Cu base, or a Sn—Zn—Bi base solder.

As illustrated in FIG. 3, each electronic component 102 is mounted, for example, on the upper surfaces of two wirings 31 extending over the space (opening 30X) between the two wirings 31. Although not illustrated in detail, the electronic component 102 is mounted on the metal film 91 formed on the upper surfaces of the wirings 31 in the same manner as the electronic component 101. A portion of the electronic component 102 overlaps, for example, the electronic component 60 (refer to FIG. 1) in plan view.

Figure 6:
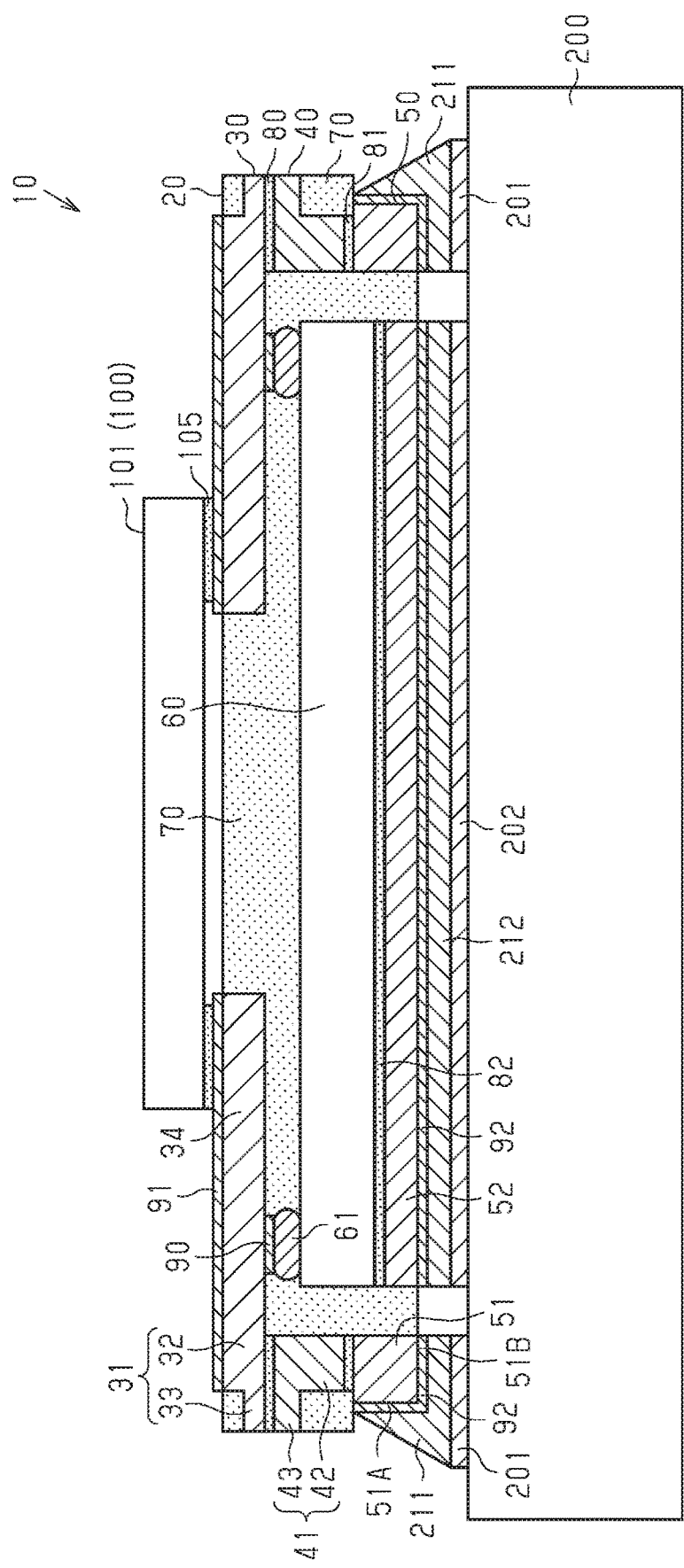
FIG. 6 is a schematic cross-sectional view of an applicable example of the electronic device illustrated in FIG. 1.

An example of a mode for mounting the electronic device 10 will now be described with reference to FIG. 6.

The electronic device 10 is mounted, for example, on a mount substrate 200 such as a motherboard. Multiple wiring films 201 and a metal film 202 are formed on the upper surface of the mount substrate 200. The electrodes 51 are joined to the wiring films 201 with solder films 211. The heat dissipation plate 52 is joined to the metal film 202 with a solder film 212. For example, the metal film 92, which is formed on the outer side surface 51A and the lower surfaces 51B of the electrodes 51, is joined to the wiring films 201 with the solder films 211. The metal film 92 is formed on the outer side surface 51A of the electrodes 51 in addition to the lower surfaces 51B of the electrodes 51. Thus, the metal film 92 is formed in three dimensions. That is, the solder films 211 are joined to the metal film 92 in three dimensions and include appropriate fillet. The solder films 211 having such a configuration have a high joint strength. Therefore, the connection reliability between the electrode 51 (metal film 92) and the wiring film 201 is improved as compared to a configuration in which the metal film 92 is formed on only the lower surfaces 51B of the electrodes 51. The metal film 92 formed on the lower surface of the heat dissipation plate 52 is joined to the metal film 202 with the solder film 212.

The material of the wiring films 201 and the metal film 202 may be, for example, copper or a copper alloy. The material of the solder films 211 and 212 may be, for example, a lead-free solder. Examples of lead-free solder include a Sn—Ag base, a Sn—Cu base, a Sn—Ag—Cu base, or a Sn—Zn—Bi base solder.

A method for manufacturing the electronic device 10 will now be described. To facilitate understanding, portions that ultimately become elements of the electronic device 10 are indicated by reference characters used to denote the final elements.

Figure 8A:
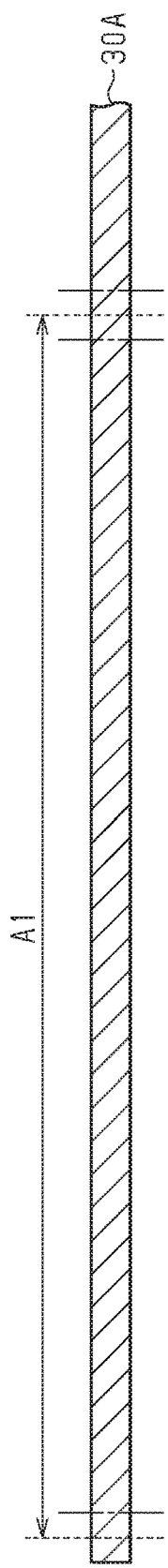
FIGS. 8A, 8B, and 8C are schematic cross-sectional views illustrating a method for manufacturing the electronic device illustrated in FIG. 1.

In the step illustrated in FIG. 8A, a large metal plate 30A is prepared. FIGS. 7A and 7B illustrate the structural body of the metal plate 30A that is formed through the steps illustrated in FIGS. 8A to 8C, which will be described later. As illustrated in FIG. 7A, the metal plate 30A includes multiple separate regions A1 that are laid out, for example, in a matrix (in FIG. 7A, 2×2). The metal plate 30, which is described above with reference to FIGS. 1 to 3, is formed in each separate region A1. In the example illustrated in FIG. 7A, the metal plate 30A includes four separate regions A1. However, the number of separate regions A1 is not particu-larly limited. To facilitate understanding, the following description will focus on one separate region A1.

As illustrated in FIG. 7A, each separate region A1 of the metal plate 30A includes the opening 30X, which is described above. The opening 30X defines section bars 36 having a lattice-pattern shape in plan view, the wirings 31 extending from the section bars 36 toward a central part of the separate region A1 to be comb-teeth-shaped in plan view, the wirings 34, and the power feeding portions 35 extending from corners of the section bars 36. The wirings 31 and 34 and the power feeding portions 35 that are formed in each separate region A1 are connected by the section bars 36 to the wirings 31 and 34 and the power feeding portions 35 that are formed in an adjacent one of the separate regions A1. After multiple electronic devices 10, each of which has the structure illustrated in FIG. 1 and includes the metal plate 30, are formed in the respective separate regions A1, the metal plate 30A is ultimately cut along the cutting lines indicated by single-dashed lines to be singulated into the electronic devices 10. In each separate region A1, the section bars 36 that are located outside the region surrounded by the single-dashed lines are eventually discarded. To clarify the drawings, in each of FIGS. 7A, 9A, and 10A, the cutting lines indicated by single-dashed lines are illustrated in only the upper left one of the separate regions A1. FIG. 7A is a plan view of the structural body illustrated in FIG. 7B taken from an upper side.

In the present example, as illustrated in FIG. 7B, a recess 30Y is formed in a position corresponding to the section bars 36 and the projections 33 of the wirings 31. For example, the metal plate 30A is thinned from the upper surface of the metal plate 30A to form the recess 30Y defining the section bars 36 and the projections 33. The opening 30X and the recess 30Y may be formed, for example, by etching performed in the step of FIG. 8C, which will be described later. FIG. 7B is a cross-sectional view taken along line 7b-7b in FIG. 7A mainly illustrating the cross-sectional structure of the upper left separate region A1 of FIG. 7A. In the same manner, FIGS. 8A to 8C, 9B, 10B, 11B, 12B, and 13A to 17B mainly illustrate the cross-sectional structure of the same separate region A1.

Figure 8B:
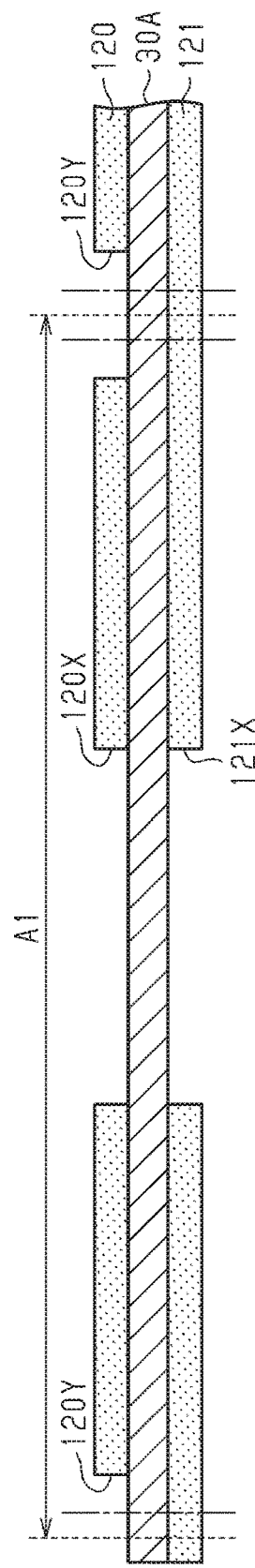

In the step illustrated in FIG. 8B, a resist layer 120 including open patterns 120X and 120Y is formed on the upper surface of the metal plate 30A, and a resist layer 121 including an open pattern 121X is formed on the lower surface of the metal plate 30A. The open patterns 120X and 121X respectively expose the upper surface and the lower surface of the metal plate 30A in positions corresponding to the region in which the opening 30X (refer to FIG. 1) is formed. The open pattern 120Y exposes the upper surface of the metal plate 30A in a position in which the recess 30Y (refer to FIG. 7B) is formed.

For example, a photosensitive dry film resist or a liquid photoresist may be used as the resist layers 120 and 121. Such a resist material may be, for example, a novolac resin or an acrylic resin. For example, when a photosensitive dry film resist is used, the upper surface or the lower surface of the metal plate 30A is laminated with a dry film through thermocompression bonding, and the dry film is patterned through photolithography to form the resist layers 120 and 121. When a liquid photoresist is used, after applying a liquid photoresist, photolithography may be performed in the same manner to form the resist layers 120 and 121.

Figure 8C:
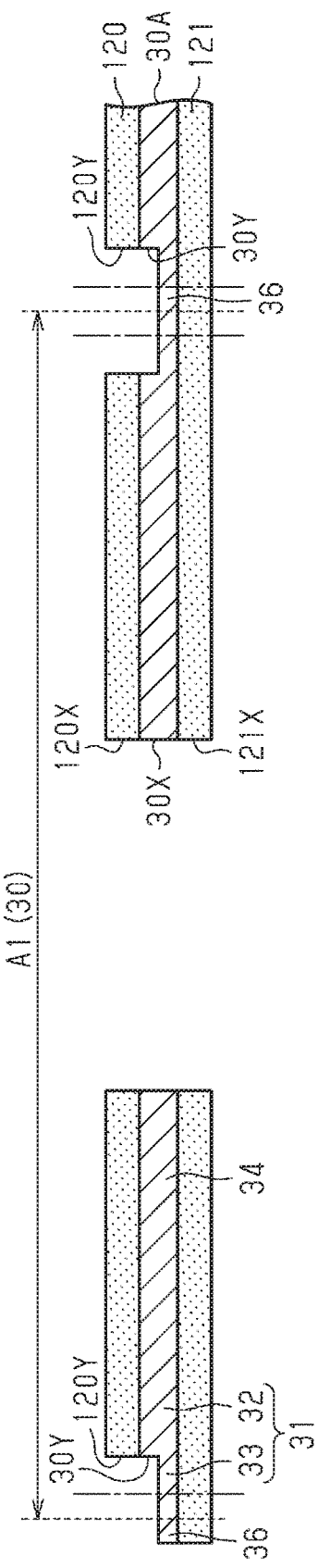

In the step illustrated in FIG. 8C, wet etching is performed on both the upper surface and the lower surface of the metal plate 30A using to the resist layers 120 and 121 as an etching mask to form the opening 30X and the recess 30Y. In the present example, the metal plate 30A exposed in the open patterns 120X and 121X is etched and removed to form the opening 30X. The opening 30X defines the section bars 36, the wirings 31 each including the body 32 and the projection 33, the wirings 34, and the power feeding portions 35 in each separate region A1 (refer to FIG. 7A). The metal plate 30A exposed in the open pattern 120Y is half-etched from the upper surface so that the metal plate 30A is thinned to a desired thickness to form the recess 30Y. The recess 30Y defines the bodies 32 of the wirings 31 together with the section bars 36 and the projections 33 of the wirings 31. An etchant used in this step may be selected in accordance with the material of the metal plate 30A. For example, when a copper plate is used as the metal plate 30A, a ferric chloride aqueous solution or a cupric chloride aqueous solution may be used as the etchant. In this case, this step may be implemented by performing spray etching on both the upper and lower surfaces of the metal plate 30A.

Then, the resist layers 120 and 121 are removed, for example, by an alkaline stripping solution (e.g., organic amine stripping solution, caustic soda, acetone, or ethanol). As a result, as illustrated in FIGS. 7A and 7B, the structure of the metal plate 30A in which the metal plate 30 is formed in each the separate region A1 is obtained.

In the present example, the opening 30X and the recess 30Y are formed by etching. Instead, the opening 30X and the recess 30Y may be formed by, for example, stamping.

Figure 9A:
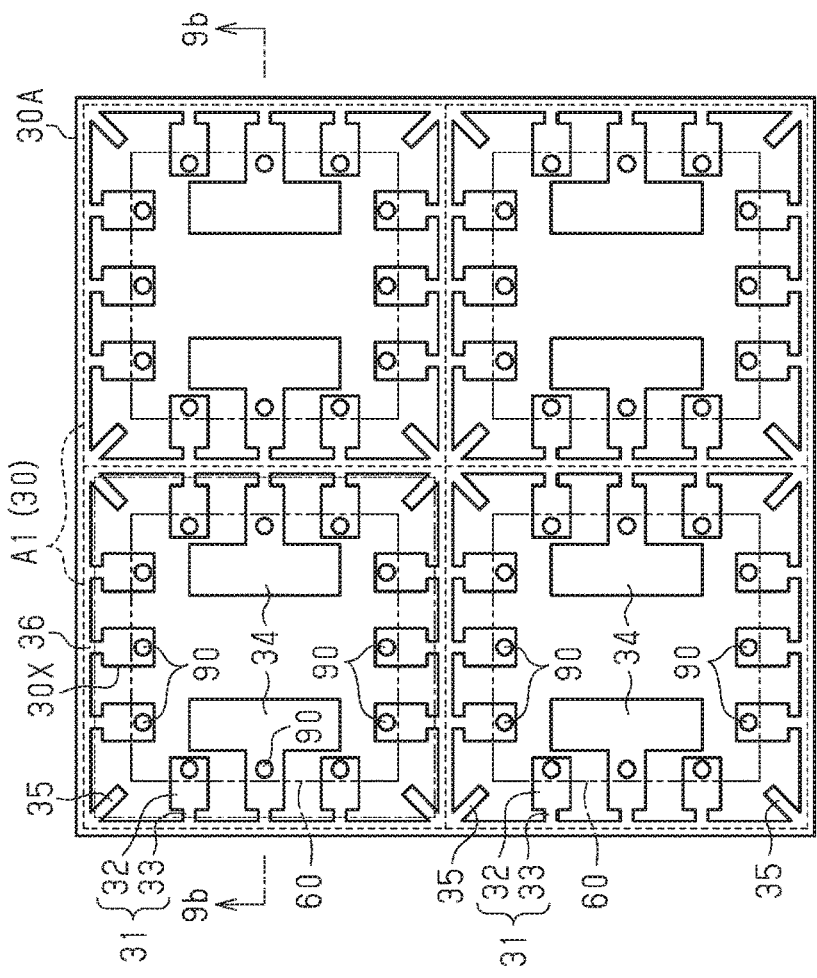
FIG. 9A is a schematic plan view illustrating a method for manufacturing the electronic device illustrated in FIG. 1.
Figure 9B:
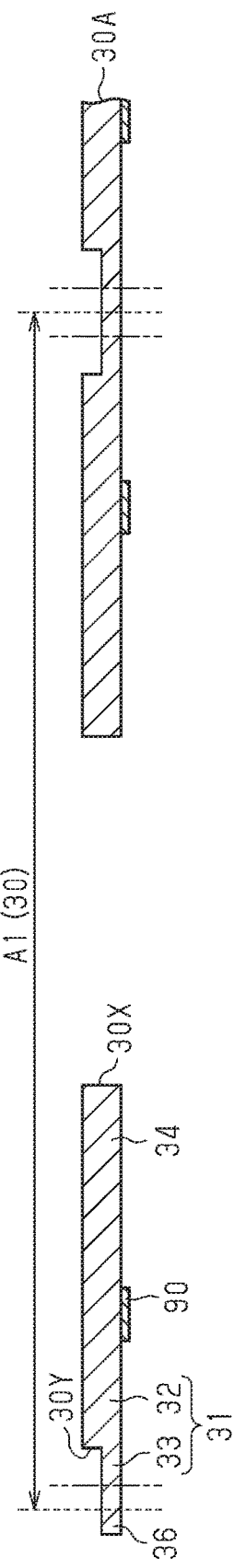
FIG. 9B is a schematic partial cross-sectional view taken along line 9b-9b in FIG. 9A.

In the step illustrated in FIGS. 9A and 9B, the metal films 90 are formed on the lower surfaces of the bodies 32 of the wirings 31. In the present example, each metal film 90 is formed, for example, on a portion of the lower surface of the corresponding body 32 in the vicinity of the peripheral edge of the mount region of the electronic component 60. The metal films 90 may be formed, for example, through an electrolytic plating process that uses the metal plate 30A as a power feeding layer. In this case, for example, a resist layer is formed to cover the entire surface of the metal plate 30A except the formation regions of the metal films 90. Then, an electrolytic plating process that uses the resist layer as a plating mask is performed to form the metal films 90 on the metal plate 30A exposed from the resist layer. Alternatively, a sparging process may be used to form the metal films 90. Alternatively, the metal films 90 may be formed on the entire lower surface of the metal plate 30A. FIG. 9A is a plan view of the structural body illustrated in FIG. 9B from a lower side.

In the steps illustrated in FIGS. 10A and 10B, the electronic component 60 having a circuit formation surface including the bumps 61 is prepared. The electronic component 60 is mounted on the lower surfaces of the wirings 31 in each separate region A1. The bumps 61 of the electronic component 60 are flip-chip joined to, for example, the metal films 90 formed on the lower surfaces of the wirings 31 in each separate region A1. For example, when the bumps 61 are solder bumps, after the bumps 61 are aligned with the metal films 90, a reflow process is performed to melt the bumps 61 (solder bumps) and electrically connect the bumps 61 to the metal films 90. When solder bumps are used as the bumps 61, the solder may have a higher melting point than solder that is used as the material of the joint materials 80 and 81 (refer to FIG. 1) formed in subsequent steps. FIG. 10A is a plan view of the structural body illustrated in FIG. 10B from a lower side.

In the step illustrated in FIGS. 11A and 11B, a large metal plate 40A is prepared. The metal plate 40A includes multiple separate regions A2 that are laid out, for example, in a matrix (in FIG. 11A, 2×2). The metal plate 40, which is described above with reference to FIGS. 1 and 4, is formed in each separate region A2. In the example illustrated in FIG. 11A, the metal plate 40A includes four separate regions A2. However, the number of separate regions A2 is not particularly limited. To facilitate understanding, the following description will focus on one separate region A2.

As illustrated in FIG. 11A, each separate region A2 of the metal plate 40A includes the opening 40X, which is described above. The opening 40X defines section bars 46 having a lattice-pattern shape in plan view, the wirings 41 extending from the section bars 46 toward a central part of the separate region A2 to be comb-teeth-shaped in plan view, and the power feeding portions 45 extending from corners of the section bars 46. The wirings 41 and the power feeding portions 45 that are formed in each separate region A2 are connected by the section bars 46 to the wirings 41 and the power feeding portions 45 that are formed in an adjacent one of the separate regions A2. The separate regions A2 are formed corresponding to the separate regions A1 of the metal plate 30A illustrated in FIG. 7A. Each separate region A2 is the same in size as each separate region A1 (refer to FIG. 7A) in plan view. After multiple electronic devices 10, each of which has the structure illustrated in FIG. 1 and includes the metal plate 40, are formed in the respective separate regions A2, the metal plate 40A is ultimately cut along the cutting lines indicated by single-dashed lines to be singulated into the electronic devices 10. In each separate region A2, the section bars 46 that are located outside the region surrounded by the single-dashed lines are eventually discarded. To clarify the drawings, in FIG. 11A, the cutting lines indicated by single-dashed lines are illustrated in only the upper left one of the separate regions A2. FIG. 11A is a plan view of the structural body illustrated in FIG. 11B from a lower side.

In the present example, as illustrated in FIG. 11B, a recess 40Y is formed in a position corresponding to the section bars 46 and the projection 43 of the wirings 41. For example, the metal plate 40A is thinned from the lower surface of the metal plate 40A to form the recess 40Y defining the section bars 46 and the projections 43. The opening 40X and the recess 40Y may be formed by performing steps that are the same as those illustrated in FIGS. 8A to 8C.

In the step illustrated in FIGS. 12A and 12B, a large metal plate 50A is prepared. The metal plate 50A includes multiple separate regions A3 that are laid out, for example, in a matrix (in FIG. 12A, 2×2). The metal plate 50, which is described above with reference to FIGS. 1 and 5, is formed in each separate region A3. In the example illustrated in FIG. 12A, the metal plate 50A includes four separate regions A3. However, the number of separate regions A3 is not particularly limited. To facilitate understanding, the following description will focus on one separate region A3.

As illustrated in FIG. 12A, each separate region A3 of the metal plate 50A includes the opening 50X, which is described above. The opening 50X defines section bars 56 having a lattice-pattern shape in plan view, the electrodes 51 extending from the section bars 56 toward a central part of the separate region A3 to be comb-teeth-shaped in plan view, the heat dissipation plate 52, and the power feeding portions 55. The power feeding portions 55 extend from corners of the section bars 56 and are formed integrally with the heat dissipation plate 52. The electrodes 51, the heat dissipation plate 52, and the power feeding portions 55 that are formed in each separate region A3 are connected by the section bars 56 to the electrodes 51, the heat dissipation plate 52, and the power feeding portions 55 that are formed in an adjacent one of the separate regions A3. The separate regions A3 are formed corresponding to the separate regions A1 of the metal plate 30A illustrated in FIG. 7A and the separate regions A2 of the metal plate 40A illustrated in FIG. 11A. The metal plate 50A including the separate regions A3 is cut along the cutting lines indicated by single-dashed lines during the manufacturing process. In each separate region A3, the section bars 56 that are located outside the region surrounded by the single-dashed lines are eventually discarded. To clarify the drawings, in FIG. 12A, the cutting lines indicated by single-dashed lines are illustrated in only the upper left one of the separate regions A3. FIG. 12A is a plan view of the structural body illustrated in FIG. 12B taken from an upper side.

In the present example, as illustrated in FIG. 12B, the metal plate 50A is thinned from the upper surface of the metal plate 50A to form the heat dissipation plate 52. The formation of the opening 50X and the thinning of the heat dissipation plate 52 may be performed through steps that are the same as those illustrated in FIGS. 8A to 8C.

In the step illustrated in FIG. 13A, the conductive joint material 81 is formed on the upper surface of the metal plate 50A. The joint material 81 is formed on the upper surfaces of the electrodes 51, for example, at positions joined to the metal plate 40A (in the present example, lower surfaces of bodies 42 of wirings 41). In addition, the joint material 81 is formed on the upper surfaces of the power feeding portions 55 (refer to FIG. 12A). The joint material 81 may be formed on the lower surface of the metal plate 40A.

The conductive joint material 80 is formed on the upper surface of the metal plate 40A. The joint material 80 is formed on the upper surfaces of the wirings 41 and the section bars 46, for example, at positions joined to the metal plate 30A (in the present example, lower surfaces of wirings 31 and section bars 36). In addition, the joint material 80 is formed on the upper surfaces of the power feeding portions 45 (refer to FIG. 11A). The joint material 80 may be formed on the lower surface of the metal plate 30A.

The joint materials 80 and 81 may be formed on the upper surfaces of the metal plates 40A and 50A, for example, by applying a solder paste with a dispenser or by transfer-printing a solder paste. Alternatively, for example, a liquid resin or a paste resin may be applied to the upper surfaces of the metal plates 40A and 50A with a dispenser to form the joint materials 80 and 81.

The adhesive layer 82 is also formed on the upper surface of the heat dissipation plate 52. The adhesive layer 82 covers, for example, the entire upper surface of the heat dissipation plate 52. The adhesive layer 82 may be formed on the rear surface of the electronic component 60. The adhesive layer 82 may be formed on the upper surface of the heat dissipation plate 52, for example, by applying a solder paste with a dispenser or by transfer-printing a solder paste. Alternatively, for example, a liquid resin or a paste resin may be applied to the upper surface of the heat dissipation plate 52 with a dispenser to form the adhesive layer 82. The adhesive layer 82 may be formed by applying a sheet of an adhesive to the upper surface of the heat dissipation plate 52.

The metal plate 40A and the metal plate 30A, on which the electronic component 60 is mounted, are sequentially arranged above the metal plate 50A so that the separate regions A1, A2, and A3 overlap (are aligned) with each other in plan view. As a result, the wirings 31 of the metal plate 30A are faced toward the wirings 41 of the metal plate 40A. The wirings 41 are faced toward the electrodes 51. The electronic component 60 is faced toward the heat dissipation plate 52. Although not illustrated in the drawings, the power feeding portions 35, 45, and 55 overlap (are aligned) with each other in plan view.

In the step illustrated in FIG. 13B, the metal plates 30A, 40A, and 50A are moved closer to each other so that the lower surface of the metal plate 40A comes into contact with the joint material 81 formed on the upper surface of the metal plate 50A, the lower surface of the metal plate 30A comes into contact with the joint material 80 formed on the upper surface of the metal plate 40A, and the rear surface of the electronic component 60 comes into contact with the adhesive layer 82 formed on the upper surface of the heat dissipation plate 52. Then, the joint materials 80 and 81 and the adhesive layer 82 are heated so that the metal plates 30A, 40A, and 50A are joined together with the joint materials 80 and 81 and that the electronic component 60 is joined to the heat dissipation plate 52 with the adhesive layer 82. As a result, the metal plate 40A is stacked on the upper surface of the metal plate 50A, and the metal plate 30A is stacked on the upper surface of the metal plate 40A. Thus, the metal plates 30A, 40A, and 50A are stacked at once.

In the step illustrated in FIG. 14A, a tape 130 is adhered to the lower surface of the metal plate 50A. For example, the tape 130 has a surface on which an adhesive (not illustrated) is applied, and the surface of the tape 130 is attached to the lower surface of the metal plate 50A. For example, the lower surface of the metal plate 50A is laminated with a sheet of the tape 130 through thermocompression bonding. The material of the tape 130 may have, for example, a superior chemical resistance or a superior thermal resistance. The material of the tape 130 may be, for example, a polyimide resin or a polyester resin. The adhesive of the tape 130A may be formed of a material that allows for easy removal of the tape 130 from the insulation layer 70 (refer to FIG. 1), which is formed by molding in a subsequent step. The material of such an adhesive may be, for example, a silicone-base adhesive material.

In the step illustrated in FIG. 14B, the insulation layer 70 is formed on the upper surface of the tape 130 to encapsulate the metal plates 30A, 40A, and 50A and the electronic component 60. In the present example, the insulation layer 70 fills the openings 30X, 40X, and 50X and the recesses 30Y and 40Y to cover the upper surface of the metal plate 30A and the entirety of the electronic component 60. The insulation layer 70 may be formed, for example, through a resin molding process. For example, when a thermosetting mold resin is used as the material of the insulation layer 70, the structural body illustrated in FIG. 14A is placed in a mold. Pressure (e.g., 5 to 10 MPa) is applied to the mold, and a liquidized mold resin is drawn into the mold. Then, the mold resin is heated and cured at a temperature of approximately 180° C. to form the insulation layer 70. In this step, during the encapsulation process, the tape 130 limits leakage of the mold resin (may be referred to as "mold flash") to the lower surface of the metal plate 50A. The process for filling the mold with the mold resin includes, for example, a transfer molding, a compression molding, and an injection molding.

When the encapsulation process is completed, the structural body illustrated in FIG. 14B that is covered with the insulation layer 70 is removed from the mold. Subsequently, the tape 130 is removed from the metal plate 50A and the insulation layer 70. The tape 130 is, for example, mechanically removed from the metal plate 50A and the insulation layer 70. As a result, as illustrated in FIG. 15A, the lower surface of the metal plate 50A and the lower surface of the insulation layer 70 are exposed to the exterior. Since the tape 130 is in contact with the lower surface of the metal plate 50A and the lower surface of the insulation layer 70, the lower surfaces are substantially flush with each other when the tape 130 is removed. At this time, the adhesive of the tape 130 may partially remain on the lower surface of the metal plate 50A after the removal of the tape 130. Such a possible remaining adhesive may be removed, for example, by ashing (dry etching using oxygen plasma).

In the step illustrated in FIG. 15B, half cutting (polishing) is performed on given portions of the structural body illustrated in FIG. 15A to an intermediate position in the thickness-wise direction to form a groove 50Y. In half cutting of the present example, the groove 50Y extends through the metal plate 50A in the thickness-wise direction so that the section bars 56 of the metal plate 50A are removed (refer to FIG. 15A). The groove 50Y exposes the outer side surface 51A of the electrode 51 to the exterior. The groove 50Y also exposes a portion of the lower surface of the insulation layer 70 that covers the side surface 42A of the body 42 of the wiring 41 to the exterior. The groove 50Y is wider than, for example, a cutting region (region between two cutting lines indicated by single-dashed lines illustrated in FIG. 16B) of the metal plates 30A and 40A. The inner wall surface of the groove 50Y is located closer to the peripheral edge of the separate regions A1 and A2 than the side surface 42A of the body 42 of the wirings 41. Hence, even when the groove 50Y is formed deeper than the designed value, the polishing of the side surface 42A of the body 42 is appropriately avoided. The groove 50Y may be formed, for example, with a dicing blade or a slicer. The formation of the groove 50Y separates the electrodes 51 from the heat dissipation plate 52 and the power feeding portions 55 (refer to FIG. 12A).

In the step illustrated in FIG. 16A, the upper surface of the insulation layer 70 is polished so that the upper surface of the metal plate 30A is exposed to the exterior. For example, the upper surface of the insulation layer 70 is polished so that the upper surface of the metal plate 30A is flush with the upper surface of the insulation layer 70. The insulation layer 70 is polished by buffing or blasting. When the lower surface of the metal plate 50A is covered with the insulation layer 70 such as mold flash, the lower surface of the insulation layer 70 may also be polished.

In the step illustrated in FIG. 16B, the metal film 91 is formed on the upper surface of the metal plate 30A exposed from the insulation layer 70, and the metal film 92 is formed on the side and lower surfaces of the metal plate 50A exposed from the insulation layer 70. The metal films 91 and 92 may be formed, for example, through an electrolytic plating process that uses the metal plates 30A, 40A, and 50A as power feeding layers. In the metal plate 30A, the wirings 31 and 34 are electrically connected to the power feeding portions 35 (refer to FIG. 7A) through the section bars 36. In the metal plate 40A, the wirings 41 are electrically connected to the power feeding portions 45 (refer to FIG. 11A) through the section bars 46. The electrodes 51 of the metal plate 50A are electrically connected to the wirings 31 of the metal plate 30A through the wirings 41 of the metal plate 40A. The heat dissipation plate 52 of the metal plate 50A is electrically connected to the metal plates 30A and 40A through the power feeding portions 35, 45, and 55 of the metal plates 30A, 40A, and 50A (respectively, refer to FIGS. 7A, 11A, and 12A). When an electrolytic plating process that uses the metal plates 30A, 40A, and 50A as power feeding layers is performed, the metal film 91 is formed on the upper surfaces of the wirings 31 and 34, and the metal film 92 is formed on the outer side surfaces 51A and the lower surfaces 51B of the electrodes 51 and the lower surface of the heat dissipation plate 52.

In the step illustrated in FIG. 17A, the electronic component 100 is mounted on the upper surfaces of the wirings 31 and 34 in the separate region A1. The electronic component 100 is mounted, for example, on the metal film 91 formed on the upper surfaces of the wirings 31 and 34 in the separate region A1 with the joint material 105.

The manufacturing steps described above manufacture the structural body corresponding to the electronic device 10 in the separate regions A1 and A2.

The insulation layer 70, the section bars 36 and 46, and the joint material 80 are cut in the cutting positions indicated by single-dashed lines illustrated in FIG. 17A with a dicing saw or the like to singulate the electronic device 10. In the present example, the cutting positions in the separate regions A1 and A2 are set to positions outward from the side surface of the metal film 92 that covers the outer side surface 51A of the electrode 51. Hence, a situation in which the dicing saw damages the surface of the metal film 92 may be appropriately avoided. As illustrated in FIG. 17B, the cutting step forms the outer side surface 33A of the projection 33, the outer side surface 43A of the projection 43, and the outer side surface 70A of the insulation layer 70 that are flush with each other and exposed as cut surfaces.

The manufacturing steps described above simultaneously manufacture multiple electronic devices 10. After singulation, the electronic device 10 may be inverted (i.e. turned upside down) and used or may be arranged at any angle.

The present embodiment has the advantages described below.

(1) The electronic device 10 includes the metal plate 30 including the wirings 31 and 34, the electronic component 60 mounted on the lower surfaces of the wirings 31 and overlapping the wirings 34 in plan view, the metal plate 50 including the electrodes 51 electrically connected to the lower surfaces of the wirings 31, and the insulation layer 70 filling space between the metal plate 30, the metal plate 50, and the electronic component 60. The upper surfaces of the wirings 34 are exposed from the insulation layer 70. With this configuration, the electronic component 100, which differs from the electronic component 60, may be mounted on the upper surfaces of the wirings 34 overlapping the electronic components 60 in plan view. Thus, the electronic components 60 and 100 are mounted above and below the metal plate 30. This reduces the size of the electronic device 10 in plan view as compared to a typical electronic device in which multiple electronic components are mounted next to one another on a lead frame.

(2) The electronic component 60 is electrically connected to the electronic components 100 by the wirings 31 and 34, which are located between the electronic components 60 and 100. Thus, the size of the electronic device 10 is reduced as compared to a configuration in which electronic components are electrically connected by wire bonding or the like. Further, as compared to the configuration in which electronic components are electrically connected by wire bonding or the like, wiring between the electronic components 60 and 100 may be shortened. This improves the electrical properties. For example, the electronic component 60, which is a semiconductor chip, may be arranged immediately below the electronic component 100, which is a chip inductor. In this case, parasitic inductance between the electronic components 60 and 100 is reduced.

(3) The electrodes 51, which are electrically connected to the lower surfaces of the wirings 31, are provided in addition to the wirings 31 on which the electronic component 60 is mounted. With this configuration, heat generated by the electronic components 60 and 100 is dissipated by the electrodes 51 in addition to the wirings 31. Thus, as compared to a configuration in which the wirings 31 are used as electrodes, the heat generated by the electronic components 60 and 100 is effectively dissipated from the wirings 31 and the electrodes 51. This limits increases in the temperature of the electronic components 60 and 100.

(4) The lower surface of the wiring 31 is joined to the upper surface of the wiring 41, which is used as the link terminal. The lower surface of the wiring 41 is joined to the upper surface of the electrode 51. With this configuration, heat generated by the electronic components 60 and 100 is dissipated by the wirings 41 in addition to the wirings 31 and the electrodes 51. Thus, as compared to a configuration in which the wirings 31 are used as electrodes, the heat generated by the electronic components 60 and 100 is effectively dissipated from the wirings 31, the wirings 41, and the electrodes 51. This limits increases in the temperature of the electronic components 60 and 100.

(5) The wirings 41, which are used as the link terminals, increase the distance from the lower surfaces of the wirings 31, which are the mount surface of the electronic component 60, to the lower surfaces of the electrodes 51. That is, the thickness of the substrate 20 is increased. With this configuration, when the electronic component 60 has a large thickness, the thickness of the wirings 41 may be increased so that the distance from the lower surfaces of the wirings 31 to the lower surfaces of the electrodes 51 is easily adjusted to allow the electronic component 60 to be incorporated in the substrate 20.

(6) The metal plate 50 includes the heat dissipation plate 52. The heat dissipation plate 52 efficiently dissipates heat generated by the electronic component 60.

(7) The metal plate 50 including the heat dissipation plate 52 is provided on the lower surface of the electronic component 60. The metal plate 30 is provided on the upper surface of the electronic component 60. Thus, the electronic device 10 has a structure resistant to bending. Bending of the electronic device 10 is appropriately limited.

(8) The projection 33 has a smaller width-wise dimension and a smaller thickness than the body 32, so that the outer side surface 33A of the projection 33 has a smaller area than the side surface 32A of the body 32. This decreases the area of the end surface of the metal plate 30 exposed from the insulation layer 70 excluding the electrode 51 (i.e., outer side surface 33A of projection 33).

(9) The projection 43 has a smaller width-wise dimension and a smaller thickness than the body 42, so that the outer side surface 43A of the projection 43 has a smaller area than the side surface 42A of the body 42. This decreases the area of the end surface of the metal plate 40 exposed from the insulation layer 70 excluding the electrode 51 (i.e., outer side surface 43A of projection 43).

(10) The metal plate 30, the metal plate 40, and the metal plate 50 may be separately manufactured. Materials of the metal plates 30, 40, and 50 may be separately selected. The substrate 20 including the metal plates 30, 40, and 50 may be used as a substrate suitable to an electronic device in accordance with various applications.

It should be apparent to those skilled in the art that the foregoing embodiments may be implemented in many other specific forms without departing from the scope of this disclosure. Particularly, it should be understood that the foregoing embodiments may be implemented in the following forms.

The embodiment and the following modified examples may be combined as long as the combined modified examples remain technically consistent with each other.

Figure 18:
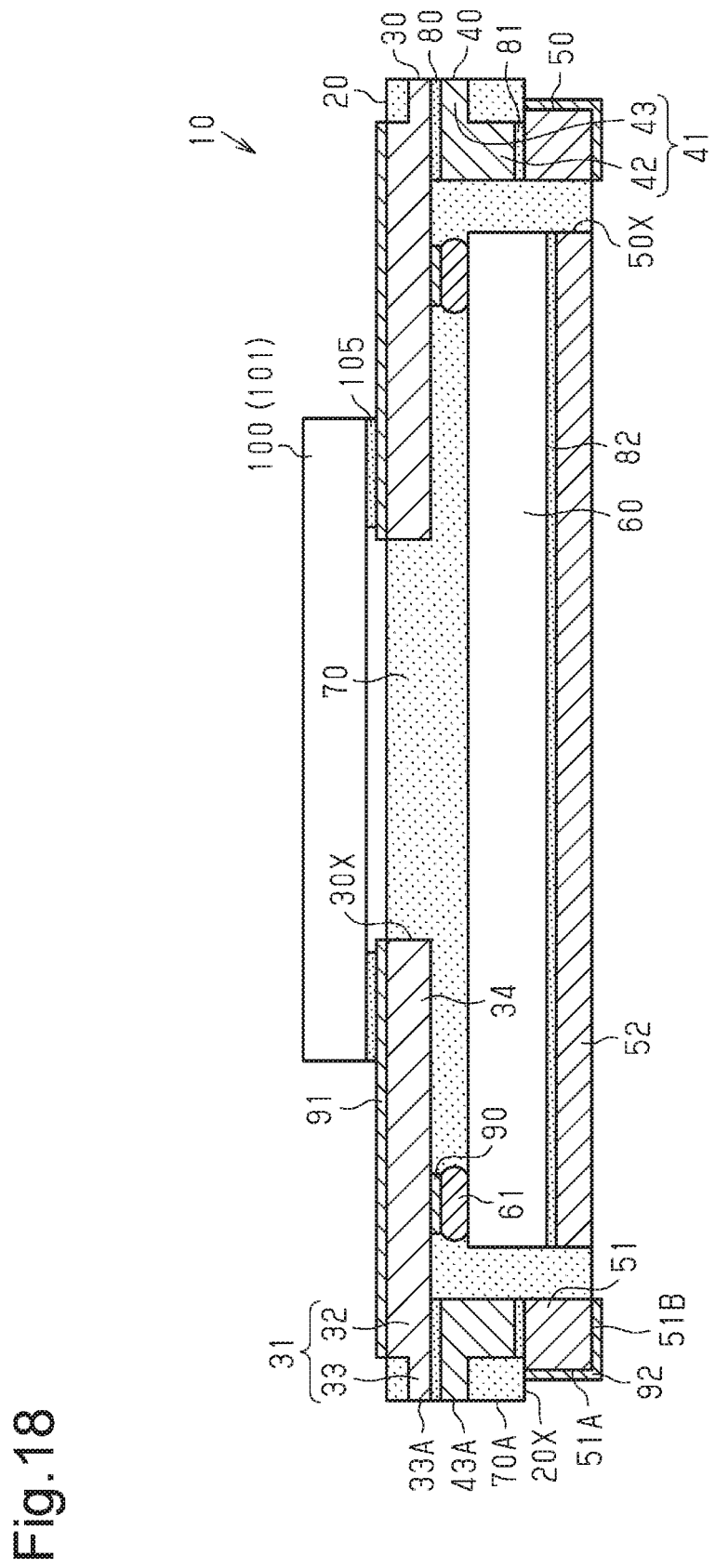

As illustrated in FIG. 18, the metal film 92 covering the lower surface of the heat dissipation plate 52 may be omitted. In this case, the power feeding portions 35 and 45 (refer to FIGS. 2 and 4, respectively) of the metal plates 30 and 40 may be omitted.

In the embodiment, the heat dissipation plate 52 is thinner than the electrodes 51. However, the heat dissipation plate 52 and the electrodes 51 may have the same thickness.

As illustrated in FIG. 19, the heat dissipation plate 52 (refer to FIG. 1) may be omitted from the metal plate 50. In this case, the power feeding portions 35, 45, and 55 (refer to FIGS. 2, 4, and 5, respectively) of the metal plates 30, 40, and 50 may be omitted.

As illustrated in FIG. 20, the metal plate 40 (refer to FIG. 1) may be omitted from the substrate 20. In this case, the upper surface of the electrode 51 is joined to the lower surface of the wiring 31. For example, the upper surface of the electrode 51 is joined to the lower surface of the wiring 31 with the joint material 80.

In the embodiment, the upper surface of the wiring 41 is joined to the lower surface of the wiring 31 with the joint material 80. However, the joining process is not particularly limited. The wiring 31 may be joined to the wiring 41, for example, by diffusion bonding. Diffusion bonding is a technique that applies heat and pressure to metal materials arranged in close contact with each other in a vacuum or inert gas environment so that the metal materials are joined to each other at an atomic level by diffusion of atoms that occurs in the joined surfaces of the metal materials. For example, when the wiring 41 is stacked on the lower surface of the wiring 31, heat and pressure are applied so that diffusion bonding is performed. For example, when copper is used as the material of the wirings 31 and 41, the heating temperature may be set to approximately 500° C. to 600° C., and the pressure may be set to 0.005 to 0.015 kN/mm². The wirings 31 and 41 that are diffusion-bonded are integrated without a boundary surface (i.e., with no gap), and the upper surface of the wiring 41 is directly joined to the lower surface of the wiring 31.

In the embodiment, the upper surface of the electrode 51 is joined to the lower surface of the wiring 41 with the joint material 81. However, the joining process is not particularly limited. The electrode 51 may be joined to the wiring 41, for example, by diffusion bonding. The electrode 51 and the wiring 41 that are diffusion-bonded are integrated without a boundary surface (i.e., with no gap), and the upper surface of the electrode 51 is directly joined to the lower surface of the wiring 41.

In the embodiment, the metal film 92 continuously covers the outer side surface 51A and the lower surface 51B of the electrode 51. However, the metal film 92 may cover, for example, only the lower surface 51B of the electrode 51.

In the embodiment, the projection 33 has a smaller width-wise dimension and a smaller thickness than the body 32. Instead, the projection 33 may have, for example, the same width-wise dimension as the body 32 or a larger width-wise dimension than the body 32. The projection 33 and the body 32 may have the same thickness.

In the embodiment, the projection 43 has a smaller width-wise dimension and a smaller thickness than the body 42. Instead, the projection 43 may have, for example, the same width-wise dimension as the body 42 or a larger width-wise dimension than the body 42. The projection 43 and the body 42 may have the same thickness.

In the embodiment, the metal films 90, 91, and 92 are formed through an electrolytic plating process. Instead, the metal films 90, 91, and 92 may be formed through an electroless plating process.

In the embodiment, the number of electronic components 60 incorporated in the substrate 20 is not particularly limited. For example, two or more electronic components 60 may be mounted on the lower surface of the metal plate 30. Different kinds of electronic components may be incorporated in the substrate 20.

In the embodiment, the number of electronic components 100 mounted on the upper surface of the metal plate 30 is not particularly limited. For example, one electronic component 100 may be mounted on the upper surface of the metal plate 30.

In the embodiment, the mode of mounting the electronic components 60 and 100 may be modified and changed in various manners. The mode of mounting the electronic components 60 and 100 may be, for example, flip-chip mounting, wire bonding mounting, solder mounting, or a combination of these.

In the embodiment, the electronic component 100 mounted on the upper surface of the metal plate 30 may be encapsulated with a resin such as a mold resin. That is, an encapsulation resin may be formed on the upper surface of the substrate 20 to encapsulate the electronic component 100.

In the embodiment, the structure of the substrate 20 is not particularly limited. The structure of the substrate 20 is not limited to a three-layer stack structure of the metal plates 30, 40, and 50. For example, four or more metal plates may be used to form the stack structure. The layout and planar shape of the wirings 31, 34, and 41 and the electrodes 51 may be modified and changed in various manners.

In the embodiment, in the process illustrated in FIGS. 13A and 13B, the metal plates 30A, 40A, and 50A are stacked at once. Instead, the metal plates 30A, 40A, and 50A may be separately stacked. For example, the upper surface of the wiring 41 may be joined to the lower surface of the wiring 31, and then the metal plate 40A may be stacked on the lower surface of the metal plate 30A. Subsequently, the upper surface of the electrode 51 may be joined to the lower surface of the wiring 41, and then the metal plate 50A may be stacked on the lower surface of the metal plate 40A.

In the embodiment, a method for manufacturing a batch of electronic devices 10 is used. However, a method for manufacturing a single electronic device 10 (one electronic device 10) may be used.

Clause

This disclosure further encompasses the following embodiment.

1. A method for manufacturing an electronic device, the method including:
forming a first metal plate including a first wiring and a second wiring through stamping or etching;
forming a second metal plate including an electrode through stamping or etching;
forming a third metal plate including a link terminal through stamping or etching;
mounting an electronic component on a lower surface of the first wiring so as to overlap the second wiring in plan view;
stacking the third metal plate on a lower surface of the first metal plate to join the link terminal to a lower surface of the first wiring;
stacking the second metal plate on a lower surface of the third metal plate to join the electrode to a lower surface of the link terminal; and
forming an insulation layer that fills a space between the first metal plate, the second metal plate, the third metal plate, and the electronic component to cover the electronic component, wherein the insulation layer exposes an upper surface of the second wiring.

2. A method for manufacturing an electronic device, the method including: forming a first metal plate including a first wiring and a second wiring through stamping or etching;
forming a second metal plate including an electrode through stamping or etching;
mounting an electronic component on a lower surface of the first wiring so as to overlap the second wiring in plan view;
stacking the second metal plate on a lower surface of the first metal plate to join the electrode to a lower surface of the first wiring; and
forming an insulation layer that fills a space between the first metal plate, the second metal plate, and the electronic component to cover the electronic component, wherein the insulation layer exposes an upper surface of the second wiring.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electronic device, comprising:
a first metal plate including a first wiring and a second wiring;
an electronic component mounted on a lower surface of the first wiring so as to overlap the second wiring in plan view;
a second metal plate including an electrode electrically connected to the lower surface of the first wiring; and
an insulation layer filling a space between the first metal plate, the second metal plate, and the electronic component and covering the electronic component,
wherein an upper surface of the second wiring is exposed from the insulation layer,
the second wiring is formed continuously and integrally with the first wiring,
the second wiring projects from the first wiring toward an inner side of the first metal plate in a first direction in plan view, and
the second wiring has a width-wise dimension that is larger than that of the first wiring in a second direction orthogonal to the first direction in plan view.

2. The electronic device according to claim 1, further comprising a third metal plate including a link terminal joined to the lower surface of the first wiring, wherein the electrode is joined to a lower surface of the link terminal.

3. The electronic device according to claim 1, wherein the electrode includes an outer side surface and a lower surface, the outer side surface of the electrode being located on a peripheral edge of the second metal plate, and the outer side surface and the lower surface of the electrode are exposed from the insulation layer.

4. The electronic device according to claim 3, further comprising a metal film continuously covering the outer side surface of the electrode and the lower surface of the electrode.

5. The electronic device according to claim 3, wherein
the insulation layer includes an outer side surface that is flush with a peripheral edge of the first metal plate in plan view,
the outer side surface of the electrode is located at an inner side of electronic device in relation to the outer side surface of the insulation layer in plan view, and
the electronic device further comprises a step formed by the outer side surface of the electrode and the outer side surface of the insulation layer.

6. The electronic device according to claim 1, wherein the second metal plate further includes a heat dissipation plate that is spaced apart from the electrode and thermally connected to the electronic component.

7. The electronic device according to claim 6, wherein a lower surface of the heat dissipation plate is exposed from the insulation layer.

8. The electronic device according to claim 7, further comprising a metal film covering the lower surface of the heat dissipation plate.

9. The electronic device according to claim 1, wherein
the first wiring includes a body and a projection, the projection projecting from a side surface of the body toward a peripheral edge of the first metal plate,
the projection has a width-wise dimension smaller than that of the body and a thickness smaller than that of the body,
the projection includes an outer side surface located on the peripheral edge of the first metal plate,
the insulation layer includes an outer side surface that is flush with the peripheral edge of the first metal plate in plan view, and
the outer side surface of the projection is exposed from the outer side surface of the insulation layer.

10. The electronic device according to claim 1, further comprising an electronic component mounted on the upper surface of the second wiring.

11. The electronic device according to claim 1, further comprising a metal film covering the upper surface of the second wiring.

12. The electronic device according to claim 1, wherein the electronic component is electrically connected to the lower surface of the first wiring through a bump.

13. The electronic device according to claim 1, wherein the first wiring is one of a plurality of first wirings that are arranged surrounding the second wiring in plan view.

14. The electronic device according to claim 13, wherein the second wiring is one of two or more second wirings that project from two or more of the plurality of first wirings toward the inner side of the first metal plate in plan view.

15. An electronic device, comprising:
a first metal plate including a first wiring and a second wiring;
an electronic component mounted on a lower surface of the first wiring so as to overlap the second wiring in plan view;
a second metal plate including an electrode electrically connected to the lower surface of the first wiring;
a third metal plate including a link terminal joined to the lower surface of the first wiring; and
an insulation layer filling a space between the first metal plate, the second metal plate, and the electronic component and covering the electronic component,
wherein an upper surface of the second wiring is exposed from the insulation layer, and
wherein the electrode is joined to a lower surface of the link terminal.

16. An electronic device, comprising:
a first metal plate including a first wiring and a second wiring;
an electronic component mounted on a lower surface of the first wiring so as to overlap the second wiring in plan view;
a second metal plate including an electrode electrically connected to the lower surface of the first wiring; and
an insulation layer filling a space between the first metal plate, the second metal plate, and the electronic component and covering the electronic component,
wherein an upper surface of the second wiring is exposed from the insulation layer,
wherein the electrode includes an outer side surface and a lower surface, the outer side surface of the electrode being located on a peripheral edge of the second metal plate,
wherein the outer side surface and the lower surface of the electrode are exposed from the insulation layer,
wherein the insulation layer includes an outer side surface that is flush with a peripheral edge of the first metal plate in plan view,
wherein the outer side surface of the electrode is located at an inner side of electronic device in relation to the outer side surface of the insulation layer in plan view, and
the electronic device further comprising a step formed by the outer side surface of the electrode and the outer side surface of the insulation layer.

* * * * *